US009076437B2

(12) United States Patent
Niemisto et al.

(10) Patent No.: US 9,076,437 B2
(45) Date of Patent: Jul. 7, 2015

(54) AUDIO SIGNAL PROCESSING APPARATUS

(75) Inventors: Riitta Elina Niemisto, Tampere (FI); Jukka Petteri Vartiainen, Tampere (FI); Bogdan Dumitrescu, Tampere (FI); Robert Bregovic, Vinica (HR)

(73) Assignee: Nokia Technologies Oy, Espoo (FI)

( * ) Notice: Subject to any disclaimer, the term of this patent is extended or adjusted under 35 U.S.C. 154(b) by 559 days.

(21) Appl. No.: 12/877,074

(22) Filed: Sep. 7, 2010

(65) Prior Publication Data

US 2011/0058687 A1 Mar. 10, 2011

(30) Foreign Application Priority Data

Sep. 7, 2009 (GB) .................................. 0915594.6

(51) Int. Cl.
*H03G 5/00* (2006.01)
*G10L 19/02* (2013.01)

(52) U.S. Cl.
CPC .................................. *G10L 19/0204* (2013.01)

(58) Field of Classification Search
CPC .. H04R 3/04; H04R 2430/03; H03H 17/0264; G10L 19/0204
USPC .............. 381/98, 99, 71.1, 71.2, 17; 382/103, 382/218, 278; 704/200.1, 500, 229
See application file for complete search history.

(56) References Cited

U.S. PATENT DOCUMENTS 5,806,025 A 9/1998 Vis
5,839,101 A 11/1998 Vahatalo
6,310,963 B1 * 10/2001 Erdol et al. .................. 382/103
6,856,653 B1 * 2/2005 Taniguchi et al. ............ 375/285
8,150,065 B2 * 4/2012 Solbach et al. ................. 381/98
2005/0027520 A1 2/2005 Mattila
2005/0060147 A1 3/2005 Norimatsu
2005/0143973 A1 * 6/2005 Taniguchi et al. ......... 704/200.1
2007/0078645 A1 4/2007 Niemisto
2007/0288235 A1 * 12/2007 Vaananen et al. ............. 704/229
2008/0162123 A1 * 7/2008 Goldin .......................... 704/205
2008/0189116 A1 * 8/2008 LeBlanc et al. ............... 704/500

FOREIGN PATENT DOCUMENTS

EP 0801377 A 10/1997
WO 03/102923 A 12/2003

OTHER PUBLICATIONS

International Search Report and Written Opinion, received in corresponding Patent Cooperation Treaty Application No. PCT/IB2010/002232. Dated Dec. 28, 2010. 16 pages.
Painter, Ted, "Perceptual Coding of Digital Audio", Proceedings of the IEEE, vol. 88 No. 4, Apr. 2000. pp. 451-513; chapter III, Sections B, C; chapter V, p. 479.

(Continued)

*Primary Examiner* — Vivian Chin
*Assistant Examiner* — Ammar Hamid
(74) *Attorney, Agent, or Firm* — Alston & Bird LLP

(57) ABSTRACT

An apparatus comprising at least one processor and at least one memory including computer program code the at least one memory and the computer program code configured to, with the at least one processor, cause the apparatus at least to perform: filtering an audio signal into at least three frequency band signals; generating for each frequency band signal a plurality of sub-band signals; processing at least one sub-band signal from at least one frequency band; and combining the processed sub-band signals to form a combined processed audio signal.

20 Claims, 11 Drawing Sheets

(56) References Cited

OTHER PUBLICATIONS

Examination Report for Application No. GB 0915594.6 dated Feb. 26, 2013.
Alizadeh, F. et al., *Second-order cone programming*, Mathematical Programming, Ser. B 95: No. 1, (2003) 3-51.
Vandenberghe, L. et al., *Semidefinite Programming*, SIAM Review 38, No. 1, 1996 Society for Industrial and Applied Mathematics, (Mar. 1996) 49-95.
SeDuMI (Self-Dual-Minimization) (dated Jun. 10, 2010) [online] [retrieved Mar. 27, 2013]. Retrieved from the Internet: http://sedumi.ie.lehigh.edu/. 1 page.
Vaidyanathan, P. P., *Multirate Systems and Filter Banks*, Prentice Hall, 1993.
Search Report received in corresponding Great Britain Application No. GB0915594.6, Jan. 27, 2010, 1 page.
Lollmann, H.W., et al., "Uniform and Warped Low Delay Filter-Banks for Speech Enhancement", Speech Communication, vol. 49, Jul. 2007, pp. 574-587.

* cited by examiner

AUDIO SIGNAL PROCESSING APPARATUS

FIELD OF THE INVENTION

The present application relates to apparatus for the processing of audio signals. The application further relates to, but is not limited to, apparatus for processing audio signals in mobile devices.

BACKGROUND OF THE INVENTION

Electronic apparatus and in particular mobile or portable electronic apparatus may be equipped with integral microphone apparatus or suitable audio inputs for receiving a microphone signal. This permits the capture and processing of suitable audio signals for processing, encoding, storing, or transmitting to further devices. For example cellular telephones may have microphone apparatus configured to generate an audio signal in a format suitable for processing and transmitting via the cellular communications network to a further device, the signal at the further device may then be decoded and passed to a suitable listening apparatus such as a headphone or loudspeaker. Similarly some multimedia devices are equipped with mono or stereo microphone apparatus for audio capture of events for later playback or transmission.

SUMMARY OF THE INVENTION

The electronic apparatus can further comprise audio capture apparatus which either includes the microphone apparatus or receives the audio signals from one or more microphones and may perform some pre-encoding processing to reduce noise. For example the analogue signal may be converted to a digital format for further processing.

This pre-processing may be required when attempting to record full spectral band audio signals from a far audio signal source, the desired signals may be weak compared to background or interference noises. Some noise is external to the recorder and may be known as stationary acoustic background or environmental noise.

Typical sources of such stationary acoustic background noise are fans such as air conditioning units, projector fans, computer fans, or other machinery. Examples of machinery noise are, for example, domestic machinery such as washing machines and dishwashers, vehicle noise such as traffic noise. Further sources of interference may be from other people in the near environment, for example humming from people neighbouring the recorder at the concert, or natural noise such as wind passing through trees.

Other interference noise may be internal to the system. For example ‘microphone noise’ or microphone self noise. The microphone self noise is not related to any particular microphone component but it is a general problem related to the fundamental noise limitations and distance attenuation of any microphone located far from the signal source. In such cases simply adding an amplifier to the microphone output does not effectively solve the problem as the amplifier amplifies the signal and noise equally.

As well as microphone self noise there are other sources of noise in audio capture apparatus. For example the analogue to digital converter may be a source of microphone noise. The microphones typically used are similar to those used in ordinary telephony and audio capturing devices and designed for a sampling rate in the range of 8 kHz or 16 kHz. Due to these design limitations, there are typically designed so that the quantization noise is lowest below 8 kHz. Furthermore the low pass filters used in the decimators of over-sampled analogue to digital converters dictate how well the higher frequencies are attenuated before they are aliased onto the lower frequencies.

Audio signal processing of these audio signals produced by the microphone are known. A filter bank structure for microphone noise suppression and similar noise suppression tasks have design requirements, other than a requirement for noise suppression or compensation to attenuate the microphone noise (or other noise) so that it reduces the noise level, of:

1. Audio quality (the audio signal should be recorded and not distorted);
2. Memory (the filterbank should not require large amounts of memory to store the filter bank configuration in other words the filter should not need to store large numbers of values);
3. Computational complexity (the filterbank should not be sufficiently complex to require significant processor capability and thus increase the power drain on the battery for the mobile device or similar); and
4. Delay (there should not be a significantly large delay in processing as this may affect the communications pathway).

Known filter bank techniques typically produce significant amounts of quantization noise or for a suitable computation complexity and memory cannot produce sufficient quality for full band audio. Other approaches are known to require very narrow bands to be set on the filters for the low frequencies. In order to produce sufficient frequency resolution on low frequencies, many filters would be required which would be expensive in both memory and computational capacity. Further approaches produce significantly long delays and have insufficient frequency resolution for high band signals.

This application proceeds from the consideration that an improved filter bank structure may be configured to have tolerable delay, memory requirements and computational complexity without sacrificing audio quality. Furthermore the structure and apparatus is designed so that besides noise suppression, other audio processing may utilise the filterbank structure and thus may save computational and memory capacity on a processor system.

There is provided according to an aspect of the invention a method comprising filtering an audio signal into at least three frequency band signals; generating for each frequency band signal a plurality of sub-band signals; processing at least one sub-band signal from at least one frequency band; and combining the processed sub-band signals to form a combined processed audio signal.

Filtering an audio signal into at least three frequency band signals may comprise: high-pass filtering the audio signal into a first of at least three frequency band signals; low-pass filtering the audio signal into a low-pass filtered signal; and downsampling the low-pass filtered audio signal to generate a combined second and third of the at least three frequency band signals.

The downsampling the low-pass filtered audio signal to generate a combined second and third of the at least three frequency band signals is preferably by a factor of 3.

Filtering an audio signal into at least three frequency band signals may further comprise: high-pass filtering the combined second and third of the at least three frequency band signals to form the second of the at least three frequency band signals; low-pass filtering the combined second and third of the at least three frequency band signals; and downsampling the low-pass filtered combined second and third of the at least three frequency band signals to generate the third of the at least three frequency band signals.

The downsampling the low-pass filtered combined second and third of the at least three frequency band signals to generate the third of the at least three frequency band signals is preferably by a factor of 2.

Generating for each frequency band signal a plurality of sub-band signal may comprise filtering the frequency band signal into a plurality of sub-bands.

Filtering the frequency band signal into a plurality of sub bands may comprise: generating a M-band bandfilter; selecting at least two of the bands from the M-band bandfilter and combining the outputs for the at least two of the bands; and applying the modified M-band bandfilter to the frequency band to generate the sub-band signals for the frequency band.

Processing at least one sub-band signal from at least one frequency band may comprise applying noise suppression to the at least one sub-band signal from the at least one frequency signal.

Combining the processed sub-band signals to form a combined processed audio signal may comprise combining the processed sub-band signals to form at least three processed frequency band signals.

Combining the processed sub-band signals to form a combined processed audio signal may further comprise: upsampling a first of the at least three processed frequency band signals; low pass filtering the upsampled first of the at least three processed frequency band signals; and combining the low pass filtered, upsampled, first of the at least three processed frequency band signals with a second of the at least three processed frequency band signals to generate a combined first and second of the at least three processed frequency band signals.

Upsampling a first of the at least three processed frequency band signals is preferably by a factor of 2.

Combining the processed sub-band signals to form a combined processed audio signal may further comprise delaying the second of the at least three processed frequency band signals so to synchronize the low pass filtered, upsampled, first of the at least three processed frequency band signals with the second of the at least three processed frequency band signals.

Combining the processed sub-band signals may comprise: upsampling the combined first and second of the at least three processed frequency band signals; low pass filtering the upsampled combined first and second of the at least three processed frequency band signals; and combining the low pass filtering the upsampled combined first and second of the at least three processed frequency band signals with a third of the at least three processed frequency band signals to generate the combined processed audio signal.

Upsampling the combined first and second of the at least three processed frequency band signals is preferably by a factor of 3.

Combining the processed sub-band signals to form a combined processed audio signal may further comprise delaying the third of the at least three processed frequency band signals so to synchronize the low pass filtered, upsampled, combined first and second of the at least three processed frequency band signals with the third of the at least three processed frequency band signals.

The method may further comprise configuring a first set of filters comprising: a first filter for the high-pass filtering of the audio signal into a first of at least three frequency band signals; a second filter for the low-pass filtering of the audio signal into a low-pass filtered signal; and a third filter for the low pass filtering of the upsampled combined first and second of the at least three processed frequency band signals.

Configuring the first set of filters may comprise configuring at least one filter parameter for the first and second filters by minimizing a stop band energy for the first and second filters whilst maintaining a deviation from flat frequency response below a predetermined level.

Configuring the first set of filters may comprise: carrying out for at least one iteration the operations of configuring at least one filter parameter for the second and third filters while keeping filter parameters for the first filter fixed and then configuring at least one filter parameter for the first and second filters while keeping filter parameters for the third filter fixed.

The method may further comprise configuring a second set of filters comprising: a first filter for the high-pass filtering of the combined second and third of the at least three frequency band signals to form the second of the at least three frequency band signals; a second filter for the low-pass filtering of the combined second and third of the at least three frequency band signals; and a third filter for low pass filtering of the upsampled first of the at least three processed frequency band signals.

Configuring the second set of filters may comprise: configuring at least one filter parameter for the first and second filters by minimizing a stop band energy for the first and second filters whilst maintaining a deviation from flat frequency response below a predetermined level.

Configuring the second set of filters may further comprise: carrying out for at least one iteration the operations of configuring at least one filter parameter for the second and third filters while keeping filter parameters for the first filter fixed and then configuring at least one filter parameter for the first and second filters while keeping filter parameters for the third filter fixed.

According to a second aspect of the invention there is provided an apparatus comprising at least one processor and at least one memory including computer program code the at least one memory and the computer program code configured to, with the at least one processor, cause the apparatus at least to perform: filtering an audio signal into at least three frequency band signals; generating for each frequency band signal a plurality of sub-band signals; processing at least one sub-band signal from at least one frequency band; and combining the processed sub-band signals to form a combined processed audio signal.

The filtering an audio signal into at least three frequency band signals may cause the apparatus at least to further perform: high-pass filtering the audio signal into a first of at least three frequency band signals; low-pass filtering the audio signal into a low-pass filtered signal; and downsampling the low-pass filtered audio signal to generate a combined second and third of the at least three frequency band signals.

The downsampling the low-pass filtered audio signal to generate a combined second and third of the at least three frequency band signals is preferably by a factor of 3.

Filtering an audio signal into at least three frequency band signals may cause the apparatus at least to further perform: high-pass filtering the combined second and third of the at least three frequency band signals to form the second of the at least three frequency band signals; low-pass filtering the combined second and third of the at least three frequency band signals; and downsampling the low-pass filtered combined second and third of the at least three frequency band signals to generate the third of the at least three frequency band signals.

The downsampling the low-pass filtered combined second and third of the at least three frequency band signals to generate the third of the at least three frequency band signals is preferably by a factor of 2.

Generating for each frequency band signal a plurality of sub-band signal may cause the apparatus at least to further perform filtering the frequency band signal into a plurality of sub-bands.

Filtering the frequency band signal into a plurality of sub bands may cause the apparatus at least to further perform: generating a M-band bandfilter; selecting at least two of the bands from the M-band bandfilter and combining the outputs for the at least two of the bands; and applying the modified M-band bandfilter to the frequency band to generate the sub-band signals for the frequency band.

Processing at least one sub-band signal from at least one frequency band may cause the apparatus at least to further perform applying noise suppression to the at least one sub-band signal from the at least one frequency signal.

Combining the processed sub-band signals to form a combined processed audio signal may cause the apparatus at least to further perform combining the processed sub-band signals to form at least three processed frequency band signals.

Combining the processed sub-band signals to form a combined processed audio signal may further cause the apparatus at least to further perform: upsampling a first of the at least three processed frequency band signals; low pass filtering the upsampled first of the at least three processed frequency band signals; and combining the low pass filtered, upsampled, first of the at least three processed frequency band signals with a second of the at least three processed frequency band signals to generate a combined first and second of the at least three processed frequency band signals.

Upsampling a first of the at least three processed frequency band signals is preferably by a factor of 2.

Combining the processed sub-band signals to form a combined processed audio signal may cause the apparatus at least to further perform delaying the second of the at least three processed frequency band signals so to synchronize the low pass filtered, upsampled, first of the at least three processed frequency band signals with the second of the at least three processed frequency band signals.

Combining the processed sub-band signals may cause the apparatus at least to further perform: upsampling the combined first and second of the at least three processed frequency band signals; low pass filtering the upsampled combined first and second of the at least three processed frequency band signals; and combining the low pass filtering the upsampled combined first and second of the at least three processed frequency band signals with a third of the at least three processed frequency band signals to generate the combined processed audio signal.

Upsampling the combined first and second of the at least three processed frequency band signals is preferably by a factor of 3.

Combining the processed sub-band signals to form a combined processed audio signal may cause the apparatus at least to further perform delaying the third of the at least three processed frequency band signals so to synchronize the low pass filtered, upsampled, combined first and second of the at least three processed frequency band signals with the third of the at least three processed frequency band signals.

The apparatus is preferably further configured to perform configuring a first set of filters comprising: a first filter for the high-pass filtering of the audio signal into a first of at least three frequency band signals; a second filter for the low-pass filtering of the audio signal into a low-pass filtered signal; and a third filter for the low pass filtering of the upsampled combined first and second of the at least three processed frequency band signals.

Configuring the first set of filters may cause the apparatus at least to further perform: configuring at least one filter parameter for the first and second filters by minimizing a stop band energy for the first and second filters whilst maintaining a deviation from flat frequency response below a predetermined level.

Configuring the first set of filters cause the apparatus at least to further perform: carrying out for at least one iteration the operations of configuring at least one filter parameter for the second and third filters while keeping filter parameters for the first filter fixed and then configuring at least one filter parameter for the first and second filters while keeping filter parameters for the third filter fixed.

The apparatus is preferably further configured to perform configuring a second set of filters comprising: a first filter for the high-pass filtering of the combined second and third of the at least three frequency band signals to form the second of the at least three frequency band signals; a second filter for the low-pass filtering of the combined second and third of the at least three frequency band signals; and a third filter for low pass filtering of the upsampled first of the at least three processed frequency band signals.

Configuring the second set of filters may cause the apparatus at least to further perform: configuring at least one filter parameter for the first and second filters by minimizing a stop band energy for the first and second filters whilst maintaining a deviation from flat frequency response below a predetermined level.

Configuring the second set of filters may cause the apparatus at least to further perform: carrying out for at least one iteration the operations of configuring at least one filter parameter for the second and third filters while keeping filter parameters for the first filter fixed and then configuring at least one filter parameter for the first and second filters while keeping filter parameters for the third filter fixed.

According to a third aspect of the invention there is provided a computer-readable medium encoded with instructions that, when executed by a computer, perform: filtering an audio signal into at least three frequency band signals; generating for each frequency band signal a plurality of sub-band signals; processing at least one sub-band signal from at least one frequency band; and combining the processed sub-band signals to form a combined processed audio signal.

According to fourth aspect of the invention there is provided an apparatus comprising filtering means for filtering an audio signal into at least three frequency band signals; sub-band generating means for generating for each frequency band signal a plurality of sub-band signals; processing means for processing at least one sub-band signal from at least one frequency band; and combination means for combining the processed sub-band signals to form a combined processed audio signal.

An electronic device may comprise apparatus as described above.

A chipset may comprise apparatus as described above.

According to a fifth aspect of the invention there is provided an apparatus comprising at least one filter configured to filter an audio signal into at least three frequency band signals; at least one filterbank configured to generate for each frequency band signal a plurality of sub-band signals; a signal processor configured to process at least one sub-band signal from at least one frequency band; and a signal combiner configured to combine the processed sub-band signals to form a combined processed audio signal.

BRIEF DESCRIPTION OF THE DRAWINGS

For better understanding of the present invention, reference will now be made by way of example to the accompanying drawings in which.

DETAILED DESCRIPTION OF THE DRAWINGS

Figure 1:
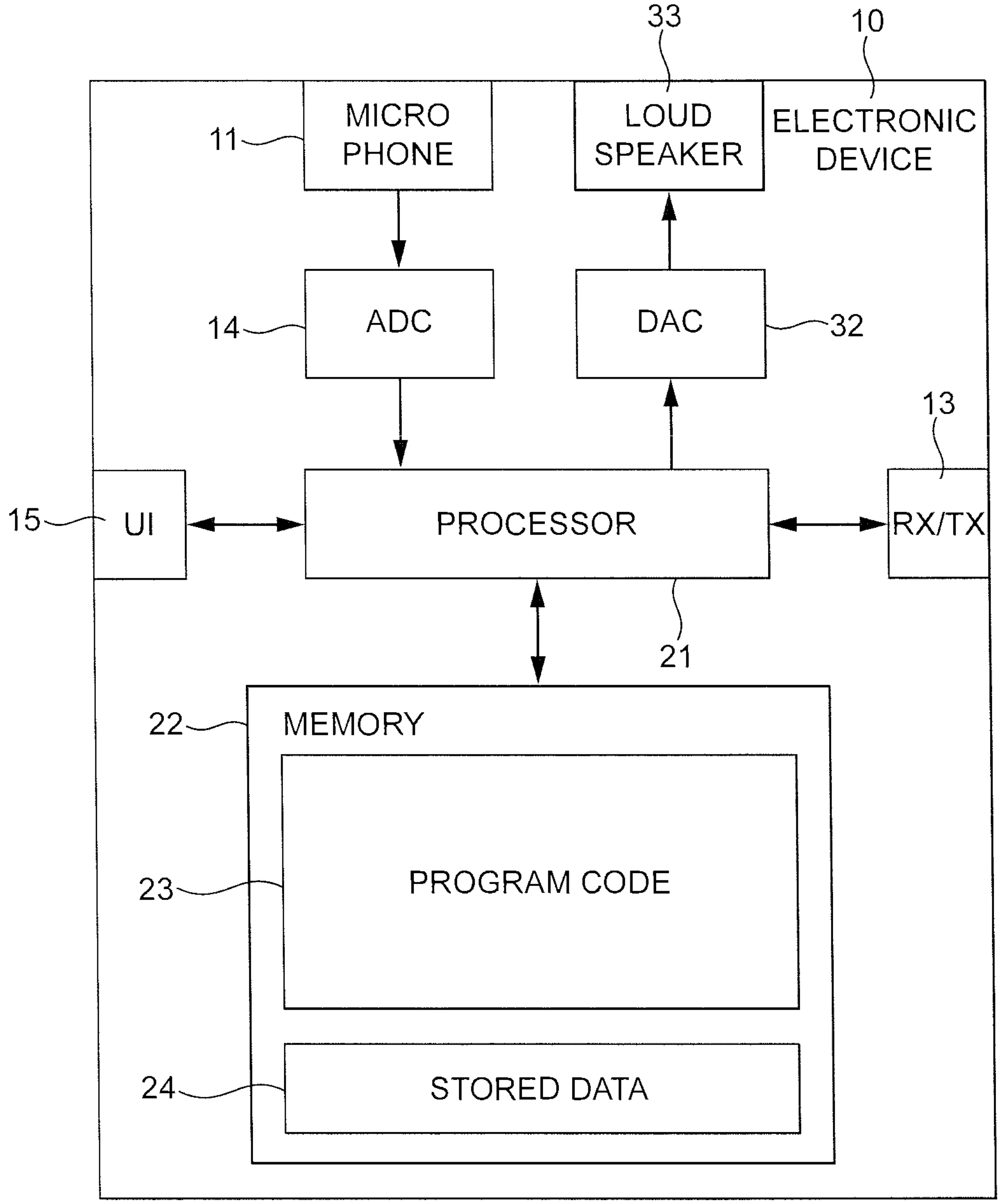
FIG. 1 shows schematically an electronic device employing embodiments of the invention.

The following describes apparatus and methods for the provision of improved audio capture devices and apparatus. In this regard reference is first made to FIG. 1 schematic block diagram of an exemplary electronic device 10 or apparatus, which incorporates an audio capture apparatus according to some embodiments of the application.

The electronic device 10 is in some embodiments a mobile terminal, mobile phone or user equipment for operation in a wireless communication system.

The electronic device 10 comprises a microphone 11, which is linked via an analogue-to-digital converter 14 to a processor 21. The processor 21 is further linked via a digital-to-analogue converter 32 to loudspeakers 33. The processor 21 is further linked to a transceiver (TX/RX) 13, to a user interface (UI) 15 and to a memory 22.

The processor 21 may be configured to execute various program codes 23. The implemented program codes 23, in some embodiments, comprise audio capture digital processing or configuration code. The implemented program codes 23 in some embodiments further comprise additional code for further processing of the audio signal. The implemented program codes 23 may in some embodiments be stored for example in the memory 22 for retrieval by the processor 21 whenever needed. The memory 22 in some embodiments may further provide a section 24 for storing data, for example data that has been processed in accordance with the application.

The audio capture apparatus in some embodiments may be implemented in at least partially in hardware without the need of software or firmware.

The user interface 15 in some embodiments enables a user to input commands to the electronic device 10, for example via a keypad, and/or to obtain information from the electronic device 10, for example via a display. The transceiver 13 enables a communication with other electronic devices, for example via a wireless communication network.

It is to be understood again that the structure of the electronic device 10 could be supplemented and varied in many ways.

A user of the electronic device 10 may use the microphone 11 for inputting speech that is to be transmitted to some other electronic device or that is to be stored in the data section 24 of the memory 22. A corresponding application in some embodiments may be activated to this end by the user via the user interface 15. This application, which may in some embodiments be run by the processor 21, causes the processor 21 to execute the code stored in the memory 22.

The analogue-to-digital converter 14 may be configured, in some embodiments, to convert the input analogue audio signal into a digital audio signal and provides the digital audio signal to the processor 21.

The processor 21 may then process the digital audio signal in the same way as described with reference to FIGS. 2 and 3.

The resulting bit stream may in some embodiments be provided to the transceiver 13 for transmission to another electronic device. Alternatively, the coded data could be stored in the data section 24 of the memory 22, for instance for a later transmission or for a later presentation by the same electronic device 10.

The electronic device 10 may in some embodiments also receive a bit stream with audio signal data from another electronic device via its transceiver 13. In these embodiments, the processor 21 executes the processing program code stored in the memory 22. The processor 21 may then in these embodiments process the received data, and may provide the decoded data to the digital-to-analogue converter 32. The digital-to-analogue converter 32 may in some embodiments convert digital data into analogue audio data and output the audio data via the loudspeakers 33. Execution of the received audio processing program code could in some embodiments be triggered as well by an application that has been called by the user via the user interface 15.

Figure 2:
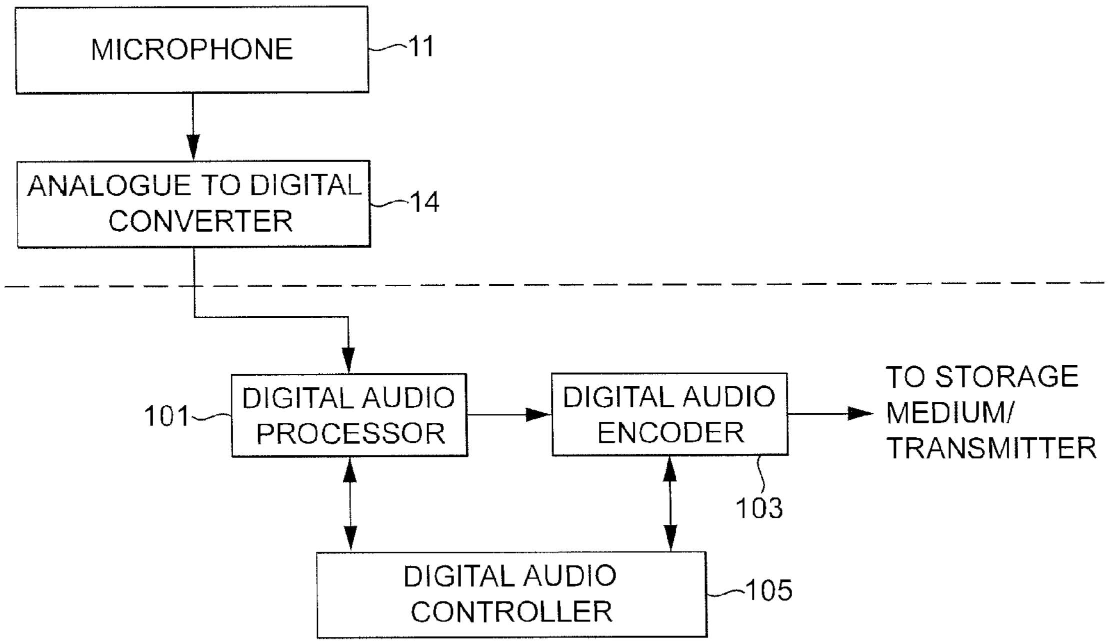
FIG. 2 shows schematically an audio capture system employing embodiments of the present invention.
Figure 3:
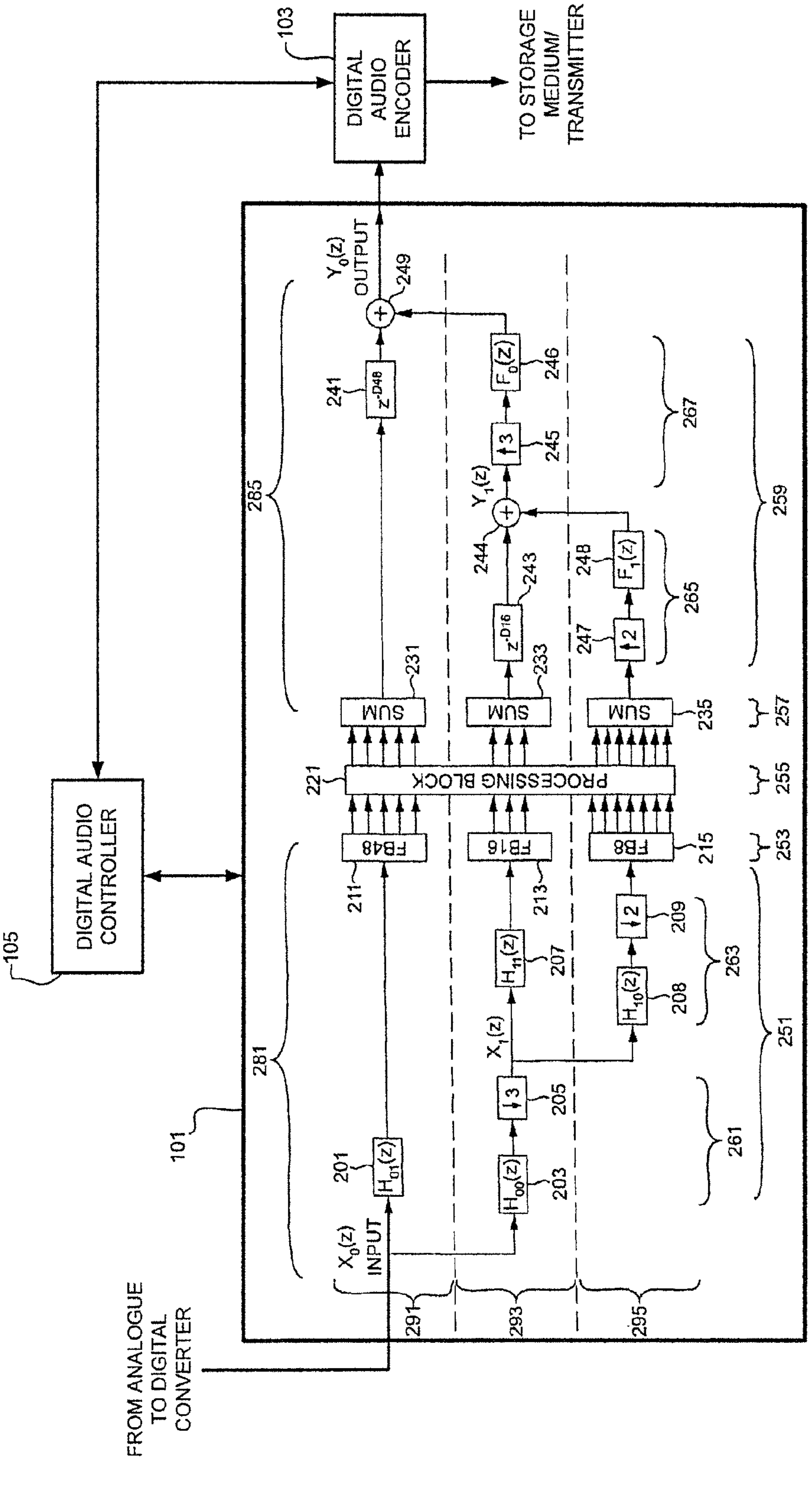
FIG. 3 shows schematically an audio capture digital processor according to some embodiments of the invention.

In some embodiments the received signal may be processed to remove noise from the recorded audio signal in a manner similar to the processing of the audio signal received from the microphone 11 and analogue to digital converter 14 and with reference to FIGS. 2 and 3.

The received processed audio data may in some embodiments also be stored instead of an immediate presentation via the loudspeakers 33 in the data section 24 of the memory 22, for instance for enabling a later presentation or a forwarding to still another electronic device.

It would be appreciated that the schematic structures described in FIGS. 2 and 3 and the method steps in FIGS. 4 to 7 represent only a part of the operation of a complete system comprising some embodiments of the application as shown implemented in the electronic device shown in FIG. 1.

FIG. 2 shows a schematic configuration view for audio capture apparatus including a microphone, analogue to digital converter, digital signal processor, digital audio controller and digital audio encoder. In other embodiments of the application the audio capture apparatus may comprise only the digital audio processor where a digital signal from an external source is input to the digital audio processor which has been preconfigured and further outputs an audio processed signal to an external encoder.

Where elements similar to those shown in FIG. 1 are described, the same reference numbers are used. The microphone 11 receives the audio waves and converts them into analogue electrical signals. The microphone 11 may be any suitable acoustic to electrical transducer. Examples of possible microphones may be capacitor microphones, electric microphones, dynamic microphones, carbon microphones, pizo-electric microphones, fibre optical microphones, liquid microphones, and micro-electrical-mechanical system (MEMS) microphones.

Figure 4:
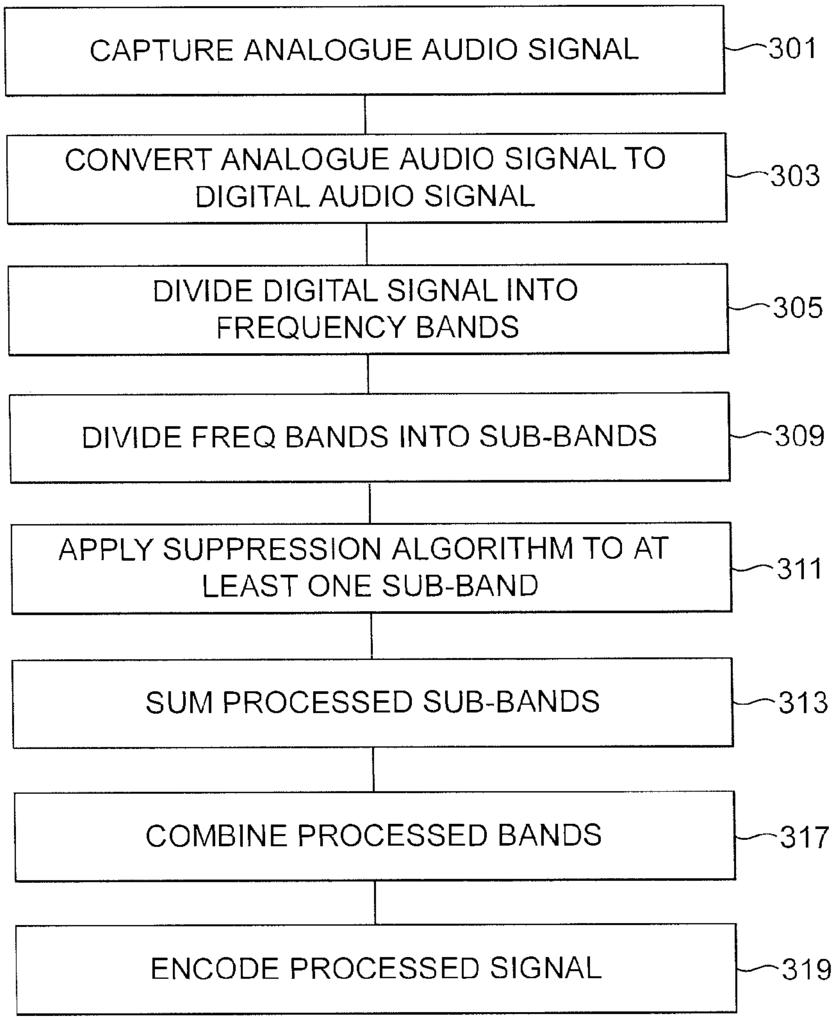
FIG. 4 shows a flow diagram illustrating the operation of the audio capture digital processor according to embodiments of the invention.

The capture of the analogue audio signal from the audio sound waves is shown with respect to FIG. 4 in step 301.

The electrical signal may be passed to the analogue to digital converter (ADC) 14.

The analogue to digital converter 14 may be any suitable analogue to digital converter for converting the analogue electrical signals from the microphone and outputting a digital signal. The analogue to digital converter may output a digital signal in any suitable form. Furthermore the analogue to digital converter 14 may be a linear or non linear analogue to digital converter dependent on the embodiment. For example the analogue to digital converter may in some embodiments be a logarithmic analogue to digital converter. The digital output may be passed to the digital audio processor 101.

The conversion of the analogue audio signal to a digital signal is shown in FIG. 4 by step 303.

The digital audio processor 101 may be configured to process the digital signal to attempt to improve the signal to noise and interference ratio (SNIR) of the audio source against the various noise or interference sources.

A schematic representation of the structure of the digital audio processor is shown in further detail in FIG. 3.

The digital audio processor 101 may comprise a frequency band and sub-band generator part 281 which receives the digital signal from the analogue to digital converter 14 and, may in some embodiments and as shown in FIG. 3, divide the digital signal into three frequency bands. The three frequency bands shown in FIG. 3 are a first (high frequency) band 291; a second (mid frequency) band 293; and a third (low frequency) band 295. The frequency band and sub-band generator part 281 may further generate sub-band values from each of the bands. In some embodiments the high frequency band 295 may be 8 kHz to 24 kHz (and therefore with a sampling frequency of 48 kHz), the mid frequency band 293 may be 4 kHz to 8 kHz (and requiring a sampling frequency of 16 kHz) and the low frequency band may be up to 4 kHz (and requiring a sampling frequency of 8 kHz).

The frequency band and sub-band generator part 281 may comprise an analysis filter bank 251 and a sub-band filter bank 253. The analysis filter bank 251 may receive the digital input and performs an initial analysis filtering of the digital signal to generate the frequency bands as indicated above. In other words the analysis filter bank 251 may output the band filtered signals in high, mid and low frequency bands to the sub-band filter banks 253.

As shown in FIG. 3, the analysis filter bank 251 may comprise an analysis filter bank outer part 261 which is configured to separate the signals into a high frequency band and a combined mid and low frequency band, and an analysis filter bank inner part 263 which is configured to separate the combined mid and low frequency band signals into a mid frequency band and a low frequency band.

The analysis filter bank outer part 261 may in some embodiments comprise a first analysis filter bank outer part filter $H_{01}$ 201 configured to receive the digital signal and output a filtered signal to the sub-band filter bank 253 and more specifically a high frequency band sub-band filter bank 211. The configuration and design of the first analysis filter bank outer part filter $H_{01}$ will be discussed in detail later but may in some embodiments be considered to be a high pass filter with a defined threshold frequency at the mid frequency band/high frequency band threshold.

The analysis filter bank outer part 261 may in some embodiments further comprise a second analysis filter bank outer part filter $H_{00}$ 203 which receives the digital signal and outputs a filtered signal to an analysis filter bank outer part mid frequency band downsampler 205. The configuration and design of the second analysis filter bank outer part filter $H_{00}$ 203 will also be discussed in detail later but may in some embodiments be considered to be a low pass filter with a defined threshold frequency at the mid frequency band/high frequency band. The analysis filter bank outer part mid band downsampler 205 may be any suitable downsampler. In some embodiments the mid band downsampler 205 is an integer downsampler of value 3. The mid band downsampler 205 may then output a downsampled output signal to a analysis filter bank inner part 263. In other words in some embodiments the mid band downsampler 205 selects and outputs every $3^{rd}$ sample from the filtered input samples to 'reduce' the sampling frequency to 16 kHz and outputs this filtered and downsampled signal to the analysis filter bank inner part 263.

In some embodiments the second analysis filter bank outer part filter $H_{00}$ 203 and the mid band downsampler 205 in combination may be considered to be a decimator for reducing the sampling rate from 48 kHz to 16 kHz.

The analysis filter bank inner part 263 may receive the output of the analysis filter bank outer part mid frequency band downsampler 205, in other words the combined mid and low frequency band signals, and further divides the combined mid and low frequency signals into a mid frequency band signal and a low frequency band signal. The analysis filter bank inner part 263 may comprise a first analysis filter bank inner part filter $H_{11}$ 207 which is configured to receive the output from the mid band downsampler 205 and output a filtered signal to the sub-band filter bank 253 and more specifically a mid frequency band sub-band filter bank 213. The configuration and design of the first analysis filter bank inner part filter $H_{11}$ will also be discussed in detail later but may in some embodiments be considered to be a high pass filter with a defined threshold frequency at the low frequency band/mid frequency band.

The analysis filter bank inner part 263 may also comprise a second analysis filter bank inner part filter $H_{10}$ 208 which is configured to receive the output from the mid band downsampler 205 and output a filtered signal to the analysis filter bank inner part low band downsampler 209. The configuration and design of the first analysis filter bank inner part filter $H_{10}$ 208 will also be discussed in detail later but may in some embodiments be considered to be a low pass filter with a defined threshold frequency at the low frequency band/mid frequency band. The analysis filter bank inner part low band downsampler 209 may be any suitable downsampler. In some embodiments the low band downsampler 209 is an integer downsampler of value 2. The low band downsampler 205 may then output a downsampled output signal to the sub-band filter bank 253 and more specifically a low frequency band sub-band filter bank 215. In other words in some embodiments the low band downsampler 209 selects and outputs every 2nd sample from the filtered samples to 'reduce' the sampling frequency to 8 kHz and outputs this filtered and downsampled signal to the sub-band filter bank.

In some embodiments the second analysis filter bank inner part filter $H_{11}$ 208 and the low band downsampler 209 in combination may be considered to be a further decimator for reducing the sampling rate from 16 kHz to 8 kHz.

The division of the signal into bands using the analysis filters and downsamplers is shown in FIG. 4 by step 305.

The sub-band filter bank 253 may, in some embodiments such as shown in FIG. 3, comprise a sub-band filter for each of the frequency bands. The high frequency band signals from the first analysis filter bank outer part filter $H_{01}$ 201 may be passed to a high frequency band sub-band filter 211, the mid frequency band signals from the first analysis filter bank inner part filter $H_{11}$ 207 may be passed to a mid frequency band sub-band filter 213, and the low frequency band signals from the inner part low band downsampler 209 are passed to the low frequency band sub-band filter 215.

Each of the sub-band filters 211, 213, and 215 may be implemented and/or designed under the control of the digital audio controller 105. The sub-band filtering is carried out in order to obtain sufficient frequency resolution for noise suppression processing. In some embodiments of the invention the digital audio controller 105 may configure cosine based modulated filter banks. This implementation may be chosen to simplify the synthesis implementation (as described later) as these embodiments may recombine the processed sub-bands back to bands using summation.

Figure 12:
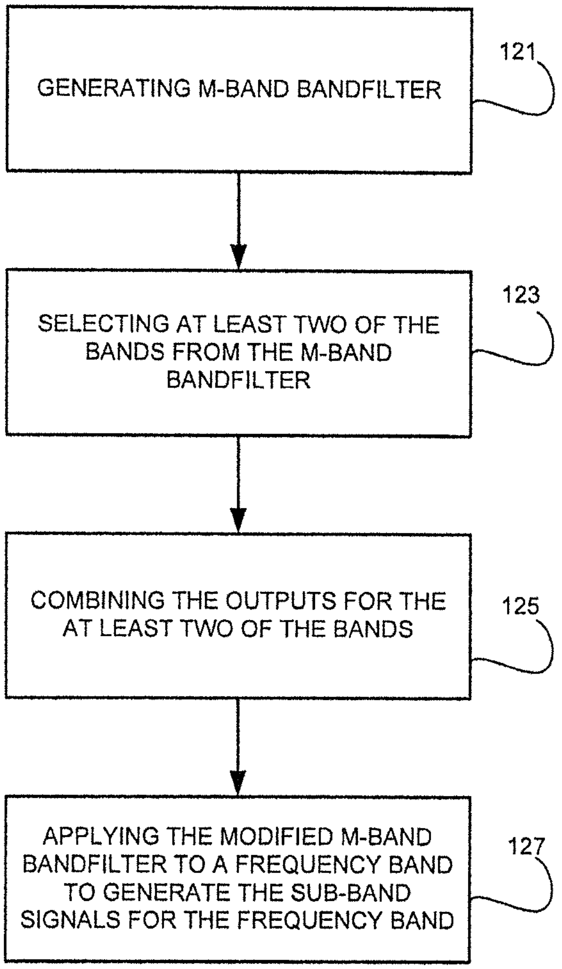
FIG. 12 shows a flow diagram illustrating an operation of the digital audio processor under the control of the digital audio controller according to embodiments of the invention.

FIG. 12 shows a flow diagram illustrating an operation of the digital audio processor 101 to implement one of the sub-band filters 211, 213, and 215 under the control of the digital audio controller 105. In operation 121, an M-band bandfilter is generated. In operation 123, at least two of the bands from the M-band bandfilter are selected. In operation 125, the outputs for the at least two of the bands are combined. In operation 127, the modified M-band bandfilter is applied to a frequency band signal to generate the sub-band signals for the frequency band.

In some embodiments, the digital audio controller 105 may implement the sub-band filter banks as a M'th band filter with a criteria which minimises a least squares value of the error between the filter and an ideal filter. In other words the sub-band filters may be chosen so to minimise the following equation:

$$\sum_{\omega\in\Omega} \lambda(\omega)|H_d(\omega) - H(\omega)|^2$$

where $\lambda(\omega)$ represents a weighting value, $H_d(\omega)$ refers to the ideal filter, $\Omega$ refers to a grid or range of frequencies and $H(z)=\Sigma h_k z^{-k}$ is an Mth band filter. The sub-band filter may be in embodiments symmetrical about a mid tap l, such that $$h_l = \frac{1}{M} \text{ and } h_{l\pm kM} = 0.$$

The digital audio controller 105 may in some embodiments choose a suitable value for M dependent on the number and width of the sub-bands of the cosine based modulated filter bank. The digital audio controller 105 may in some embodiments combing sub-bands generated by the sub-band filter bank as the input signal itself has meaningful content only on certain frequencies. The digital audio controller 105 may implement this configuration in these embodiments by merging neighbouring sub-bands by adding up the corresponding sub-band filter bank filter coefficients.

Furthermore the digital audio controller 105 may use in some embodiments and in order to save memory the same filter design for all three sub-band filter banks. It would be appreciated that the digital audio controller 105 may thus implement the same filter design and produce differing results. Using the previous three band example where the high frequency band uses a 48 kHz sampling frequency, the mid band uses a 16 kHz sampling frequency and the low band uses a 8 kHz sampling frequency a prototype filter suitable for all three frequency band sub-band filters may output sub-band bandwidth on the mid frequency band twice the sub-band bandwidth on the low frequency band. Similarly the sub-band bandwidth for the high frequency band is six times the bandwidth of the low frequency band sub-bands (or in other words three times the bandwidth on the mid frequency band sub bands) in embodiments using the same prototype filter.

Figure 10:
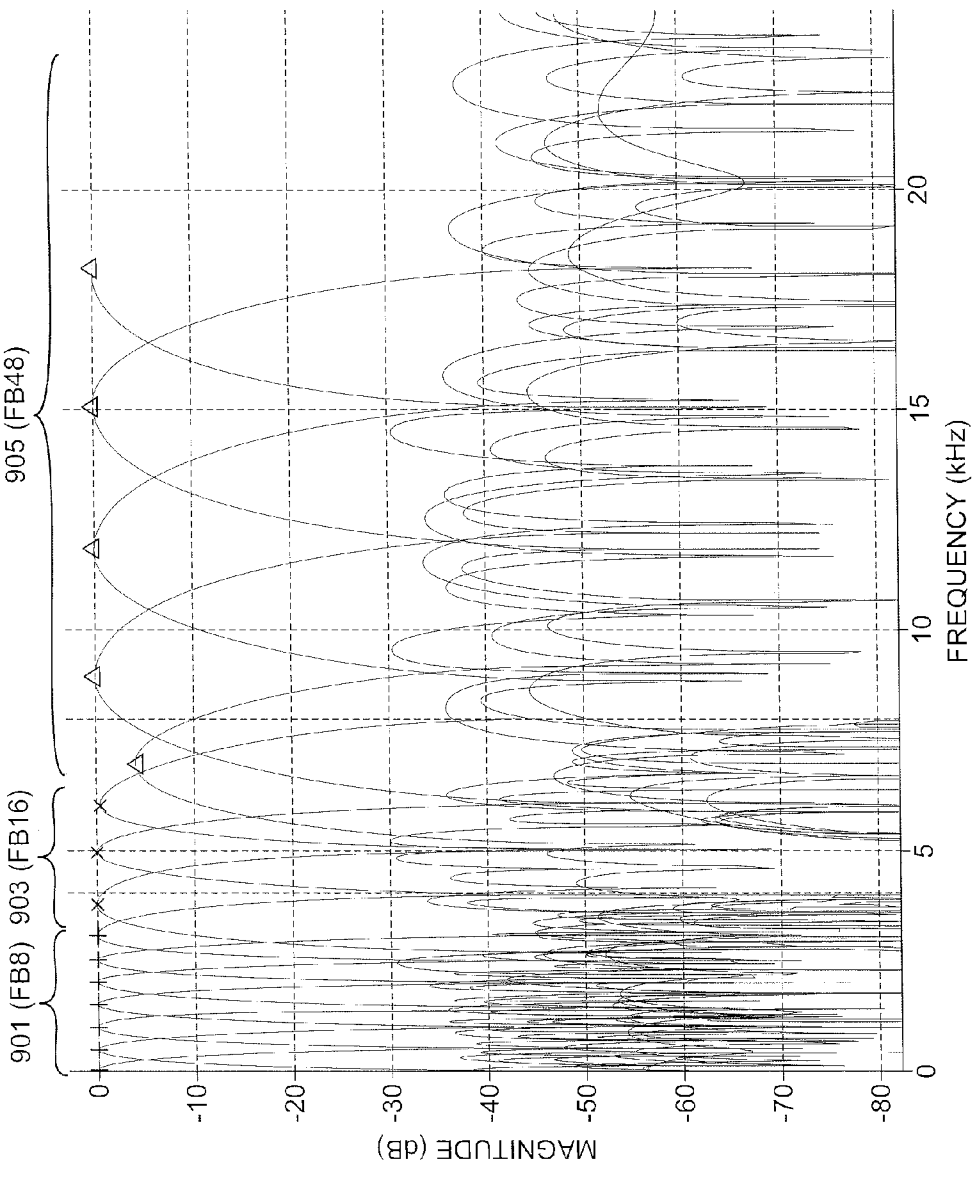
FIG. 10 shows schematically spectrograms depicting the sub-band filter banks responses according to embodiments of the invention.
Figure 11:
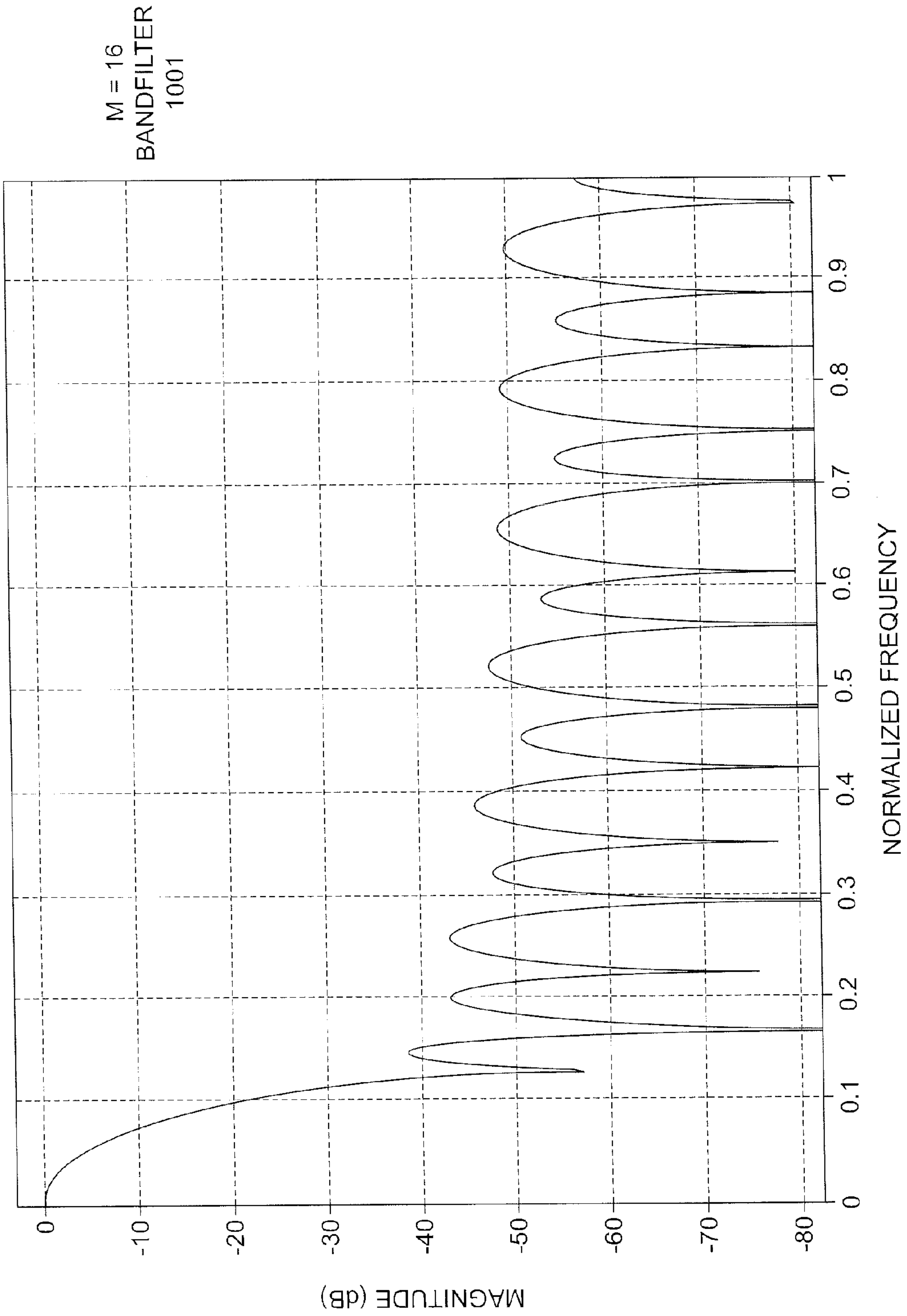
FIG. 11 shows schematically spectrograms depicting the magnitude response of a prototype M'th band filter, where M =16, response according to some embodiments of the invention.

FIG. 10 shows an example sub-band configuration frequency response output for a high frequency band sub-band filter for receiving 48 kHz sampled signals FB48 211, a mid frequency band sub-band filter for receiving 16 kHz sampled signals FB16 213 and a low frequency band sub-band filter for receiving 8 kHz sampled signals FB8 215. In this example a M=16 filter bank design is used for all three sub-band filters. A suitable M=16 filter bank may be shown with respect to the magnitude response against normalized frequency plot shown by FIG. 11. The frequency responses from the 'low frequency band sub-band filter bank 215' is shown by the crosses '+' 901. In this example seven sub-band filtered signals are generated by merging the three highest sub-bands by adding up the corresponding filter bank coefficients for the three highest sub-bands. The frequency response shown in this example is shown following a convolution with the $H_{00}$ filter, and the interpolated (downsampled) $H_{10}$ filter responses.

The frequency responses from the same filterbank design representing the 'mid frequency band sub-band filter bank FB16 213' is shown by the crosses 'x' 903. In this example three sub-band filtered signals are generated from the filter by merging the lowest five into a single sub-band and the three highest sub-bands by adding up the corresponding filter bank coefficients for the lowest five and highest three sub-bands. The frequency response shown in this example is shown following a convolution with the $H_{00}$ filter, and the interpolated (downsampled) $H_{11}$ filter responses.

The frequency responses for the 'high frequency band sub-band filter bank FB48 211' is shown by the triangles 'Δ' 905. In this example the lowest three sub-bands are merged into a single sub-band and the three highest sub-bands are merged into a single sub-band by adding up the corresponding filter bank coefficients for the lowest three and highest three sub-bands. The frequency response shown in this example is shown following a convolution with the $H_{01}$ filter.

Thus in these embodiments there are altogether 9 filters with different coefficients, these are seven filters for the low frequency sub-band filter bank FB8 and filters corresponding to lowest bands in both the mid frequency sub-band filter bank FB16 and the high frequency sub-band filter bank FB48.

In some embodiments the audio controller may configure the sub-band filter banks so that the stop-band attenuation is moderate. This may be suitable in these embodiments as there is no decimation or interpolation and therefore stronger attenuation may not be needed.

The dividing of the bands into sub-bands is shown within FIG. 4 in step 309.

The output of these sub-band filter banks is passed to the noise processing device 255 and specifically the processing block 221.

The digital audio processor 101 may further comprise the noise processing device 255 and specifically a processing block 221 configured to receive the sub-band audio signals, apply a noise reduction algorithm to the sub-band signals and output the processed sub-band signals to the sub-band to band converter 257.

The processing block 221 may be designed or configured by the digital audio controller 105 for suppression of low level background noise. The number of sub-bands processed by the processing block 221 may be determined by the digital audio controller 105 dependent on the audio application. Thus in some embodiments where attenuation of considerably strong background noises is required better frequency resolution may be required for the lowest frequencies and thus more lower frequency sub-bands selected to be processed. However in other embodiments where if it is required to simply modify the audio spectrum (such as in dynamic range control (DRC) or equalisation) a smaller number of sub-bands may be chosen.

The processing block 221 may be configured to perform noise suppression using any suitable noise suppression technique fitting with the processing of audio signal sub-bands. For example in some embodiments the processing block 221 may be configured to perform noise suppression techniques such as the techniques shown in U.S. Pat. No. 5,839,101, or US-2007/078645.

The application of the suppression algorithm to at least one sub-band is shown in FIG. 4 by step 311.

The noise processing device 255 outputs the processed signal to the combination part 285 of the digital audio processor 101. The combination part 285 may comprise a sub-band to band converter 257 and a synthesis filter bank 259.

The output of the noise filtering device 255 may be configured to be connected to the sub-band to band converter 257 and may in embodiments receive from the noise filtering device 255, and specifically in some embodiments the processing block 221, the processed sub-band signals and output to the synthesis filter bank 259 combined processed frequency band signals.

The sub-band to band converter 257 may comprise three summation devices, each device configured to receive the processed sub-band signals for one of the frequency bands and further configured to sum the received sub-band signals to generate the processed frequency band signals.

In other words the sub-band to band converter 257 may comprise a high frequency band summation device 231 configured to sum the processed audio signals associated with the sub-bands for the 48 kHz high frequency band and combine the signals to output a high frequency band processed signal to the synthesis filter bank 259. The high frequency band summation device in some embodiments outputs the high frequency band processed signal to a first synthesis filter bank outer part filter $F_{01}$ 241 which in some embodiments may be a pure delay filter designated $z^{-D48}$.

Furthermore the sub-band to band converter 257 in some embodiments may comprise a mid frequency band summation device 233 configured to sum the processed audio signals associated with the sub-bands for the 16 kHz mid frequency band and combine the signals to output a mid frequency band processed signal to the synthesis filter bank 259. The mid frequency band summation device, in some embodiments, may output the mid frequency band processed signal to a first synthesis filter bank inner part filter $F_{11}$ 243 which in some embodiments may be a pure delay filter designated $z^{-D16}$.

In these embodiments the sub-band to band converter 257 may further comprise a low frequency band summation device 235 configured to sum the processed audio signals associated with the sub-bands for the 8 kHz low frequency band and combine the signals to output a low frequency band processed signal to the synthesis filter bank 259. The low frequency band summation device 235 in some embodiments outputs the high frequency band processed signal to a first synthesis filter bank inner part interpolator 247.

The combining of the processed sub-bands to output processed frequency band signals is shown in FIG. 4 by step 313.

The synthesis filter bank 259 may therefore in some embodiments receive the processed digital audio signal divided into frequency bands and filter and combine the bands to generate a single processed digital audio signal.

As shown in FIG. 3, the synthesis filter bank 259 may comprise a synthesis filter bank inner part 265 which is configured to combine the signals from the low and mid frequency bands into a combined mid and low frequency band, and a synthesis filter bank output part 267 which is configured to combine the combined mid and low frequency band signals with the high frequency band signals into a single processed audio signal output.

The synthesis filter bank inner part 265 may receive the output of the mid frequency band summation device 233 and the low frequency band summation device 235, in other words the combined processed mid and low frequency band signals, and filter and combine them into the combined processed mid and low frequency signals.

The synthesis filter bank inner part 265 may comprise a first synthesis filter bank inner part filter $F_{11}$ 243 (which in some embodiments may also be designated filter $z^{-D16}$) which is configured to receive the output from the mid frequency band summation device 233 and output a filtered signal to a first input of a synthesis filter bank inner part combiner 244. The design and implementation of the first synthesis filter bank inner part filter 243 will be discussed in further detail below however it may be considered in some embodiments to be a pure delay filter with the delay chosen to match the filtering delay of the low frequency band branch of the synthesis filter band inner part.

The synthesis filter bank inner part 265 may also comprise a synthesis filter bank inner part low band upsampler 247 configured to receive the processed low frequency band signal which is sampled in this example at 8 kHz and upsample the signal to the mid frequency band sampling frequency. In this example the interpolator is an integer upsampler of value 2, in other words the upsampler adds a new sample value between every pair of samples which may be considered to be a resampling of the processed low frequency signal at 16 kHz. The low band upsampler 247 may then output an up-sampled output signal to the second synthesis filter bank inner part filter $F_1$ 248 (in some embodiments the second synthesis filter bank inner part filter may also be designated $F_{10}$).

The configuration and design of the second synthesis filter bank inner part filter $F_1$ 248 will also be discussed in detail later but may in some embodiments be considered to be a low pass filter with a defined threshold frequency at the low frequency band/mid frequency band. The output of the second synthesis filter bank inner part filter $F_1$ 248 may be output to the second input of the synthesis filter bank inner part combiner 244.

In some embodiments the second synthesis filter bank inner part filter $F_1$ 248 and the low band interpolator 209 in combination may be considered to interpolate the signal from a sampling rate of 8 kHz to 16 kHz.

The synthesis filter bank inner part combiner 244 receives the filtered processed mid frequency band signal and filtered processed low frequency band signal and outputs a combined processed mid and low frequency band signal to the synthesis filter bank output part 267.

The synthesis filter bank outer part 267 may in some embodiments comprise a first synthesis filter bank outer part filter $F_{01}$ 241 (which in some embodiments may be designated $z^{-D48}$) and is configured to receive the output from the high frequency band summation device 231 and output a filtered signal to a first input of a synthesis filter bank outer part combiner 249. The configuration and design of the first synthesis filter bank outer part filter $F_{01}$ will be discussed in detail later but may in some embodiments be considered to be a pure delay filter with a defined delay sufficient to synchronize with the output of the second synthesis filter bank outer part filter $F_0$ 246.

The synthesis filter bank outer part 267 may in some embodiments further comprise a synthesis filter bank outer part mid/low band upsampler 245 configured to receive the output of the synthesis filter bank inner part combiner 244 and output an upsampled version suitable for combination with the high frequency band signals. In some embodiments the mid/low band upsampler 245 is an integer upsampler of value 3. In other words in some embodiments the mid/low band upsampler 245 adds two new samples between ever pair of samples to 'increase' the sampling frequency from 16 kHz to 48 kHz. The mid/low band upsampler 245 may then output an upsampled output signal to the second synthesis filter bank outer part filter $F_0$ 246.

The second synthesis filter bank outer part filter $F_0$ 246 which in some embodiments may be designated $F_{00}$ receives the upsampled signal from the synthesis filter bank outer part mid/low band upsampler 245 and outputs a filtered signal to the second input of the synthesis filter bank outer part combiner 249. The configuration and design of the second synthesis filter bank outer part filter $F_0$ 246 will also be discussed in detail later but may in some embodiments be considered to be a low pass filter with a defined threshold frequency at the mid frequency band/high frequency band.

In some embodiments the second synthesis filter bank outer part filter $F_0$ 246 and the mid/low band upsampler 245 in combination may be considered to be a interpolator for increasing the sampling rate from 16 kHz to 48 kHz.

The synthesis filter bank outer part combiner 249 receives the filtered processed high frequency band signals and filtered processed mid/low frequency band signals and outputs a combined signal. In some embodiments this output is to the digital audio encoder 103 for further encoding prior to storage or transmitting.

The operation of combining the processed band is shown in FIG. 4 by step 317.

The digital audio encoder 103 may further encode the processed digital audio signal according to any suitable encoding process. For example the digital audio encoder 103 may apply any suitable lossless or lossy encoding process such as any of the International Telecommunications Union Technical board (ITU-T) G.722 or G729 coding families. In some embodiments the digital audio encoder 103 is optional and may not be implemented.

The operation of further encoding of the audio signal is shown in FIG. 4 by step 319.

The digital audio controller 105 according to embodiments of the invention may be configured to choose the parameters for implementing filterbank filters $H_{00}$, $H_{01}$, $H_{10}$, $H_{11}$, $F_0$ and $F_1$. In audio signals there may be generally very strong components on the lowest frequencies. These components may be mirrored onto the high band frequencies during any interpolation process. In other words the interpolation filters (the synthesis filters) $F_0$ and $F_1$ may be configured by the digital audio controller to have one or more zeros which correspond to the strongest mirror frequencies and attenuate these mirrored components. The configuration of the filters by the digital audio controller may be performed before the audio processing described above and may be performed once or more than once depending upon the embodiments. For example the digital audio controller 105 in some embodiments may be a separate device to the digital audio processor and on factory initialization and testing procedures the digital audio controller 105 configures the parameters of the digital audio processor before being removed from the apparatus. In other embodiments the digital audio controller is capable of reconfiguring the digital audio processor as often as required by the apparatus or user. For example if the apparatus is initially configured for high fidelity capture of detailed music for example a classical music concert the controller may be used to reconfigure the apparatus and the digital audio processor for speech audio capture to voice communication on a cellular communication system.

Figure 5:
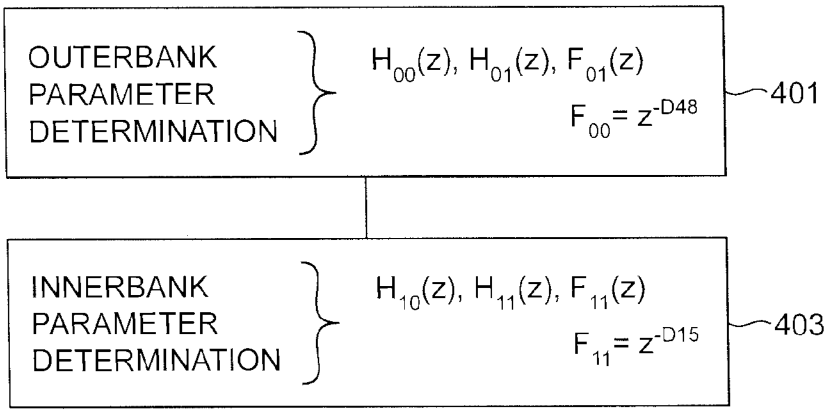
FIG. 5 shows a flow diagram illustrating the operation of the audio capture digital processor controller according to embodiments of the invention.

The configuration or setting of the filters by the digital audio controller 105 can be seen with reference to FIG. 5 which shows a two stage process for the determination of synthesis and analysis filters parameters.

The first operation by the digital audio controller 105 is that of determining the implementation parameters for the analysis filterbank outer part filters and the synthesis filterbank outer part filters. In other words the configuration of the filters $H_{00}$ 203, $H_{01}$ 201, $F_0$ 246 (also designated $F_{00}$) and $F_{10}$ 241 (also designated $z^{-D48}$).

With respect to the apparatus shown in FIG. 3, if an input to the digital audio processor 101 is defined as $X_0(z)$ and the output from the digital audio processor 101 as $Y_0(z)$ in the Z domain, the discrete Laplace domain, then the input-output relationship for the outer parts of the filterbanks (if we assume there is no processing within the processing block and the inner filterbank) may be expressed as the following equation:

$$Y_0(z) = \frac{1}{3}F_{00}(z)H_{00}(z)X_0(z) + F_{01}(z)H_{01}(z)X_0(z) + \frac{1}{3}\left(F_{00}(z)H_{00}\left(e^{j\frac{2}{3}\pi}z\right)X_0\left(e^{j\frac{2}{3}\pi}z\right) + F_{00}(z)H_{00}\left(e^{j\frac{4}{3}\pi}z\right)X_0\left(e^{j\frac{4}{3}\pi}z\right)\right)$$

The controller seeks in some embodiments to make the output a delayed version of the input with low distortion, in other words $Y_0(z) \approx z^{-L_0}X_0(z)$ where $L_0$ refers to the delay produced by the filterbank.

If in some embodiments of the invention there is a further assumption that the synthesis (or interpolation) filter is of the form $F_0(z) = \tilde{F}_0(z)G_0(z)$ where $$G_0(z) = (z^{-1} - e^{j2/3\pi})(z^{-1} - e^{-j2/3\pi}) = z^{-2} - 2\cos(2/3\pi)z^{-1} + 1$$

then the interpolator (the upsampler 245 and the $F_0$ filter 246 combined) may be configured to have a zero at 16 kHz.

Figure 6:
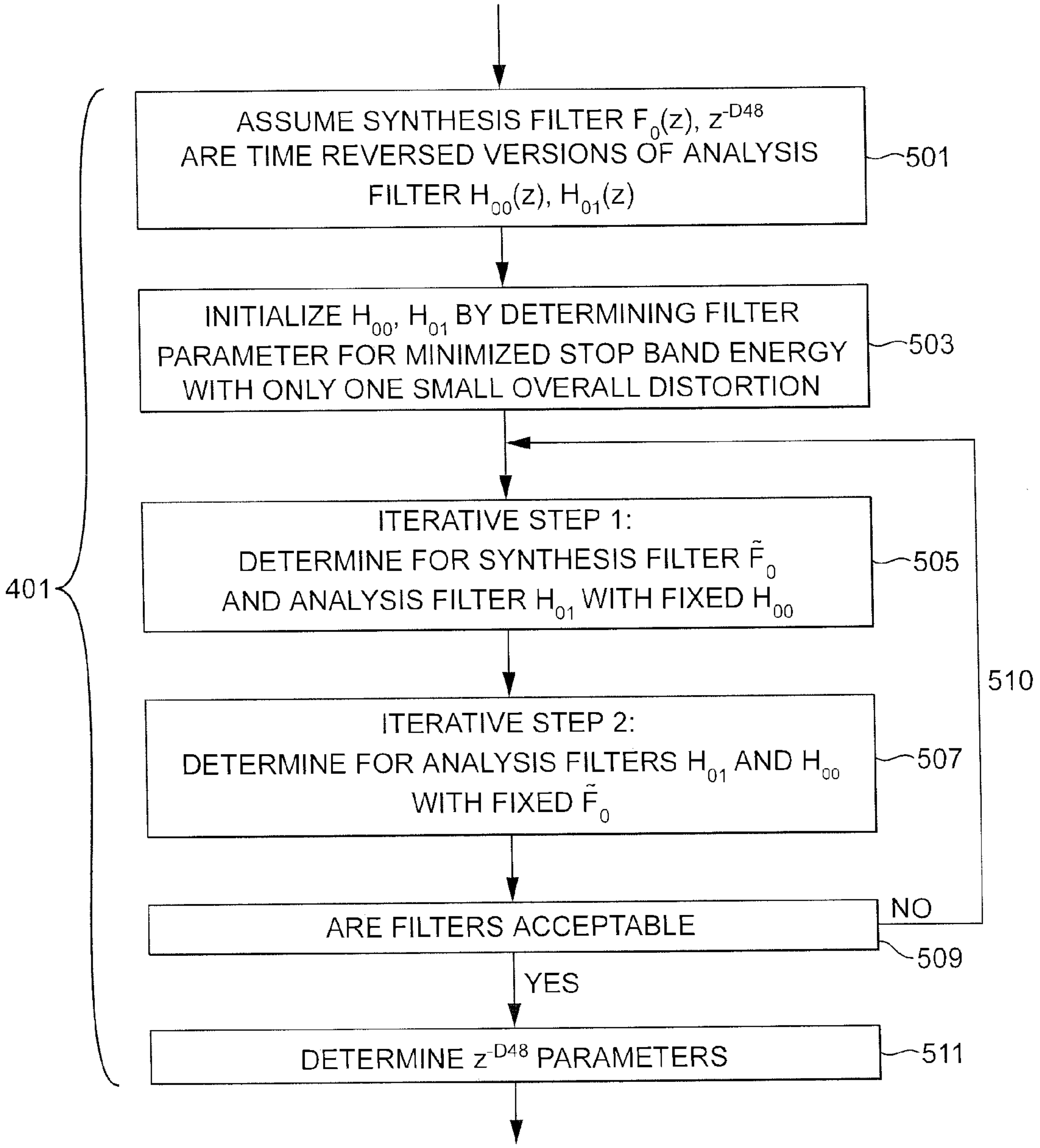
FIG. 6 shows a flow diagram illustrating the operation of the outer filter bank optimization according to embodiments of the invention.

With reference to FIG. 6, the determination of the analysis filterbank outer part filters and the synthesis filterbank outer part filters as implemented in some embodiments is described in further detail.

For the initial operation controller configures the synthesis outer part filters $F_{01}$ ($z^{-D48}$) 241 and $F_{00}$ 246 to be time reversed versions of the analysis outer part filters $H_{01}$ 201 and $H_{00}$ 203 respectively.

The controller 105 operates with an initial assumption of the synthesis filters are time reversed versions of the analysis filters. This initial assumption operation can be seen in FIG. 6 by step 501.

The controller, having carried out this, now attempts to initially calculate the parameters for the analysis filters $H_{00}$ and $H_{01}$ using the following expression:

$$\min_{H_{00},H_{01}} \lambda_{00}\int_{\omega_{00}}^{\pi}|H_{00}(\omega)|^2+\lambda_{01}\int_{0}^{\omega_{01}}|H_{01}(\omega)|^2$$

$$\text{s.t.}\left|\frac{1}{3}|H_{00}(\omega)|^2+|H_{01}(\omega)|^2-1\right|\le\delta_0(\omega),\ \omega\in\Omega$$

where Ω refers to a grid of frequencies, $\delta_0(\omega)$ defines the distortion (the deviation from flat frequency response) allowed in each of these frequencies, $\omega_{00}$ and $\omega_{01}$ refer to the stop band edges of the mid/low and high frequency bands respectively and $\gamma_{00}$ and $\gamma_{01}$ represents weighting function values.

The controller 105 may now consider this minimisation to be expressed as a semidefinite programming (SDP) problem of which a unique solution may be found using any known semidefinite programming solution.

Thus in some embodiments the controller may determine initial filter parameters which minimise the stop band energy with the constraint of only having one small overall distortion (a small deviation from flat frequency response) and which also forces the pass band value close to unity.

The operation of determining $H_{00}$, $H_{01}$ filter parameters by minimising stop band energy with only one small overall distortion criteria (in other words minimising stop band energy whilst maintaining a deviation from flat frequency response below a predetermined level) can be seen in FIG. 6 by step 503.

The controller 105 may then remove the assumption that the synthesis outer part filters $F_{01}$ ($z^{-D48}$) 241 and $F_{00}$ 246 are time reversed versions of the analysis outer part filters $H_{01}$ 201 and $H_{00}$ 203 respectively.

The controller 105 may in some embodiments initialize an iterative step process.

The controller may determine parameters for the second synthesis filter bank outer part filter $F_0$ 246 and the first analysis filter bank outer part filter $H_{01}$ 201 with a fixed second analysis filter bank outer part filter $H_{00}$ 203, using the following expression:

$$\min_{\tilde{F}_0,H_{01}} \lambda_{02}\int_{\omega_{00}}^{\pi}\left|\tilde{F}_0(\omega)G_0(\omega)\right|^2+\lambda_{01}\int_{0}^{\omega_{01}}|H_{01}(\omega)|^2$$

$$\text{s.t.}\left|\frac{1}{3}H_{00}(\omega)\tilde{F}_0(\omega)G_0(\omega)+H_{01}(\omega)e^{-j\omega D_{48}}-e^{-j\omega L_0}\right|\le\delta_0(\omega),$$

$$\omega\in\Omega$$

with fixed $H_{00}$ (ω).

The operation of the first part of the iteration where the filters parameters for $F_0$ and $H_{01}$ are selected with respect to a fixed $H_{00}$ is shown in FIG. 6 by step 505.

The controller 105 in the second part of the iteration then attempts to determine parameters for the first analysis filter bank outer part filter $H_{01}$ 201 and the second analysis filter bank outer part filter $H_{00}$ 203 with respect to the following equation:

$$\min_{H_{00},H_{01}} \lambda_{00}\int_{\omega_{00}}^{\pi}|H_{00}(\omega)|^2+\lambda_{01}\int_{0}^{\omega_{01}}|H_{01}(\omega)|^2$$

$$\text{s.t.}\left|\frac{1}{3}H_{00}(\omega)\tilde{F}_0(\omega)G_0(\omega)+H_{01}(\omega)e^{-j\omega D_{48}}-e^{-j\omega L_0}\right|\le\delta_0(\omega),$$

$$\omega\in\Omega$$

where there is a fixed $\tilde{F}_0(\omega)$.

The operation of determining parameters for the first and second analysis filters $H_{01}$ 201 and $H_{00}$ 203 with a fixed second synthesis filter bank outer part filter $\tilde{F}_0(\omega)$ is shown in FIG. 6 by step 507.

Both of the above iterative process may be expressed as a second order cone (SOC) problem and solved iteratively by the controller 105. As before Ω refers to a grid of frequencies, $\delta_0(\omega)$ defines a parameter which controls how much distortion is allowed in each of the frequencies, $\omega_{00}$ and $\omega_{01}$ refer to the mid/low and high frequency band edge frequencies respectively and $\lambda_{00}$, $\lambda_{01}$, and $\lambda_{02}$ represent weighting functions.

The controller 105 may thus attempt to minimise the stop band energy with the constraint to have only one overall small distortion (in other words reducing the stop band energy whilst maintaining a deviation from flat frequency response below a predetermined level). This process may force the pass band close to one.

The controller 105 may then perform a check step to determine whether or not the filters generated by the current parameters are acceptable with respect to predefined criteria. The check step is shown in FIG. 6 by step 509.

Where the check step determines that the filters are acceptable, the operation then passes to step 511. Where the check step determines that further iteration is required, the controller 105 passes back to the first part of the iteration determining the parameters for the synthesis filter $F_0$ and analysis filter $H_{01}$ with respect to a fixed $H_{00}$.

The iterative process may depend very much on the initialization processes. In tests performed by the inventors it has been observed that shorter initial filters $H_{00}$ and $H_{01}$ provide generally better solutions. Furthermore the controller may use a time reversed $H_{00}$ (in other words a maximum phase filter) as an initial estimate for the $H_{00}$ filter where time synchronisation between the sub-bands is important. Thus in some embodiments although normally analysis filters are minimum phase and synthesis filters maximum phase, for the initial estimates, setting $H_{00}$ to a maximum phase may better match with the $H_{01}$ delay (which is approximately linear phase).

With respect to the overall delay $L_0$ produced by the filter bank, the controller 105 may set the value according to any suitable value. Also as indicated previously the controller 105 may determine parameters for the first synthesis filter bank outer part filter $F_{01}$ 201, the pure delay filter $z^{-D48}$, dependent on the length of $H_{01}$ filter. The determination of the $z^{-D48}$ parameters is shown in FIG. 6 by step 511. In embodiments the group delay of $H_{01}$ and the pure delay filter $z^{-D48}$ will determine approximately to the value defined for $L_0$. The controller 105 may in some embodiments determine the parameters for the first analysis filter bank outer part filter $H_{01}$ 201 to have approximately linear phase, in other words having a constant delay. The controller 105 may in some embodiments determine filter parameters so that the filters $H_{00}$ 203 and $F_0$ 246 delay may differ between frequencies but have a convolved filter characteristic $H_{00}(z)F_0(z)$ having an approximately constant delay $L_0$ on all frequencies.

Figure 8:
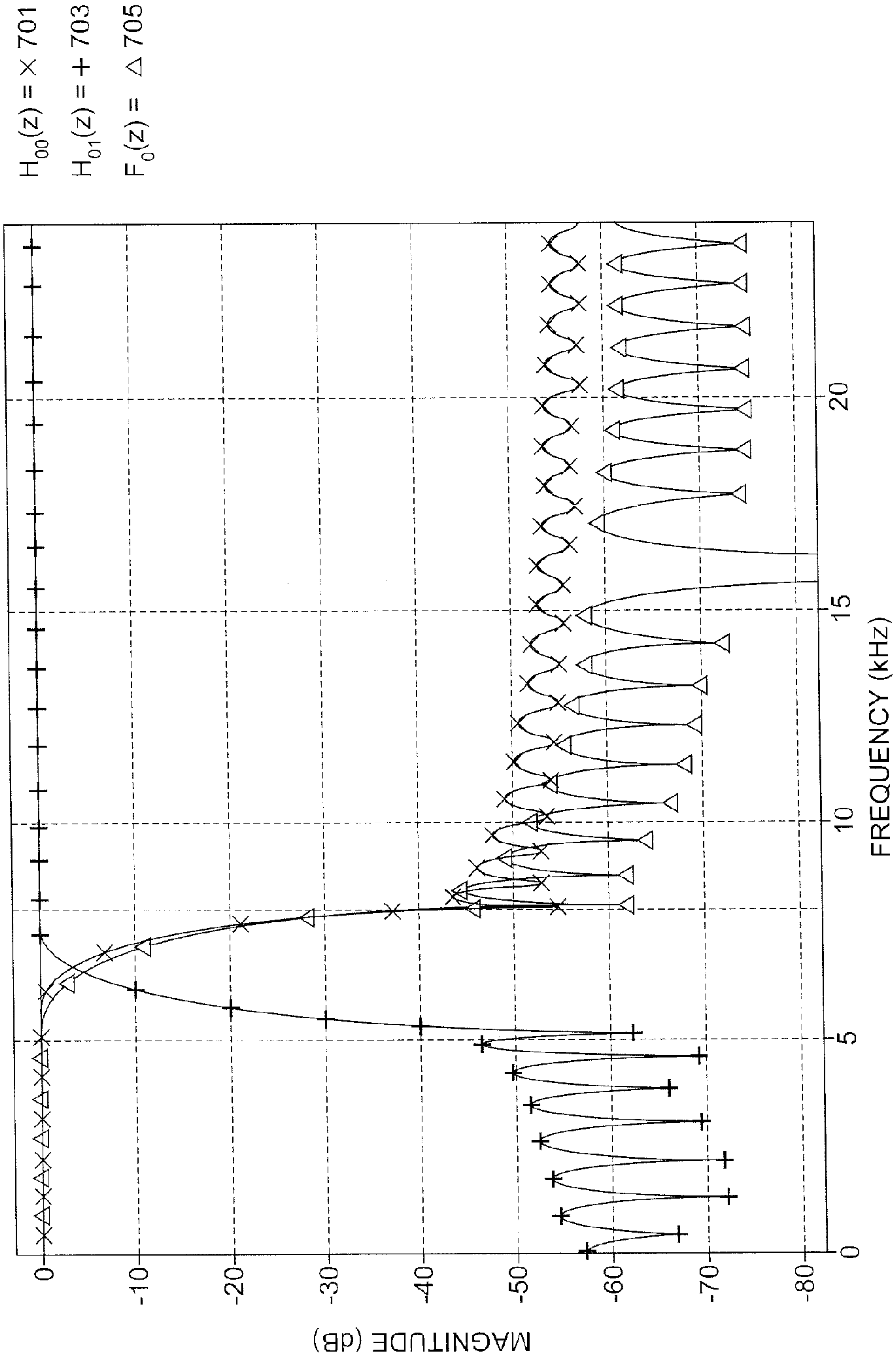
FIG. 8 shows schematically spectrograms depicting the outer filter bank responses according to embodiments of the invention.

With respect to FIG. 8, suitable example frequency responses for the second synthesis filter bank outer part filter $F_0$ 246, the first analysis filter bank outer part filter $H_{01}$ 201 and second analysis filter bank outer part filter $H_{00}$ 203 are shown. In these examples the high frequency band analysis filter, the first analysis filter bank outer part filter $H_{01}$ 201, frequency response is marked by crosses '+' 703 and has a near linear response in the pass band from 8 kHz upwards. The mid/low band analysis filter, the second analysis filter bank outer part filter $H_{00}$ 203, frequency response is shown by the trace marked by crosses 'x' 701 and is shown with a stop band from 8 kHz (attenuation greater than 40 db). The mid/low synthesis filter, the second synthesis filter bank outer part filter $F_0$ 246, frequency response is defined by the trace marked by triangles 'Δ' 705 is shown with shown with a stop band from 8 kHz (attenuation greater than 40 db) and a zero at 16 kHz.

The controller 105 in some embodiments focuses on the interpolator filter, the second synthesis filter bank outer part filter $F_0$ 246, because the typical audio signal low frequency components are relatively strong and in these embodiments the controller may configure the interpolator filter $F_0$ 246 to significantly attenuate the low frequency components minor images.

In some embodiments of the invention, the outer filter band and inner filter bank downsamplers may not be configured to have strong attenuation because the frequencies that alias after attenuation are relatively low compared to the frequency components for the audio signal on the low frequency band.

The controller 105 may in some embodiments increase the weighting for $\lambda_{02}$ in the first optimisation of the iterative step which may subsequently increase the stop band attenuation of the second synthesis filter bank outer part filter $F_0$ 246. Also as shown in the Figures, one or more zeros at the normalized frequency of ⅔π (which corresponds to 16 kHz in the examples above) may be introduced to attenuate the strongest mirror frequencies.

The determining of implementation parameters for the analysis filter bank outer part filters and the synthesis filter bank outer part filters is shown in FIG. 5 by step 401.

The second operation by the digital audio controller 105 is that of determining the implementation parameters for the analysis filterbank inner part filters and the synthesis filterbank inner part filters. In other words the configuration of the filters $H_{11}$ 207, $H_{10}$ 208, $F_1$ 246 (also designated $F_{10}$) and $F_{11}$ 243 (also designated $z^{-D16}$). With respect to FIG. 7, the inner bank filter parameter determination process is shown in further detail.

With respect to the apparatus shown in FIG. 3, if an input to the digital audio processor 101 inner analysis filter bank is defined as $X_1(z)$ and an output from the inner synthesis filter bank is defined as $Y_1(z)$ in the Z domain, then the input-output relationship (assuming no processing by the processing block) may be defined as the following expression:

$$Y_1(z)=\frac{1}{2}F_{10}(z)H_{10}(z)X_1(z)+\frac{1}{2}F_{10}(z)H_{10}(-z)X_1(-z)+F_{11}(z)H_{11}(z)X_1(z).$$

The controller 105 may attempt to configure the filters so that the output $Y_1$ is a delayed version of the input $X_1$ with low distortion, in other words, $Y_1(z)\approx z^{-L1}X_1(z)$. Where $L_1$ refers to the delay produced with the inner filter bank filters.

The controller 105 operates with an initial assumption of the synthesis filters are time reversed versions of the analysis filters. This initial assumption operation can be seen in FIG. 7 by step 601.

The controller 105, under this assumption, may produce an initial estimation for the analysis filters $H_{10}$ and $H_{11}$ by selecting filters with a minimised stop band energy with a constraint of only having one small overall distortion (in other words reducing the stop band energy whilst maintaining a deviation from flat frequency response below a predetermined level). In other words, by solving the following expression:

$$\min_{H_{10},H_{11}} \lambda_{10}\int_{\omega_{10}}^{\pi}|H_{10}(\omega)|^2+\lambda_{11}\int_0^{\omega_{11}}|H_{11}(\omega)|^2$$

$$\text{s.t.}\left|\frac{1}{2}|H_{10}(\omega)|^2+|H_{11}(\omega)|^2-1\right|\le\delta_1(\omega),\ \omega\in\Omega$$

where Ω refers to a grid of frequencies, $\delta_1(\Omega)$ defines the distortion allowed in each of these frequencies, $\omega_{10}$ and $\omega_{11}$ refer to stop band edges of the low and mid band frequency ranges respectively and $\lambda_{10}$ and $\lambda_{11}$ represent weighting functions.

The controller 105 may now consider this minimisation to be expressed as a semidefinite programming (SDP) problem of which a unique solution may be found using any known semidefinite programming solution. An example of available Semidefinate programming solutions are those know as SeDuMi (Self-Dual-Minimization) available at http://sedumi.ie.lehigh.edu/. A semidefinate programming solutions are further described in the paper about the subject: Lieven Vandenberghe, Stephen Boyd, "Semidefinite Programming", SIAM Review 38, March 1996, pp. 49-95 (http://stanford-.edu/~boyd/papers/pdf/semidef_prog.pdf).

Figure 7:
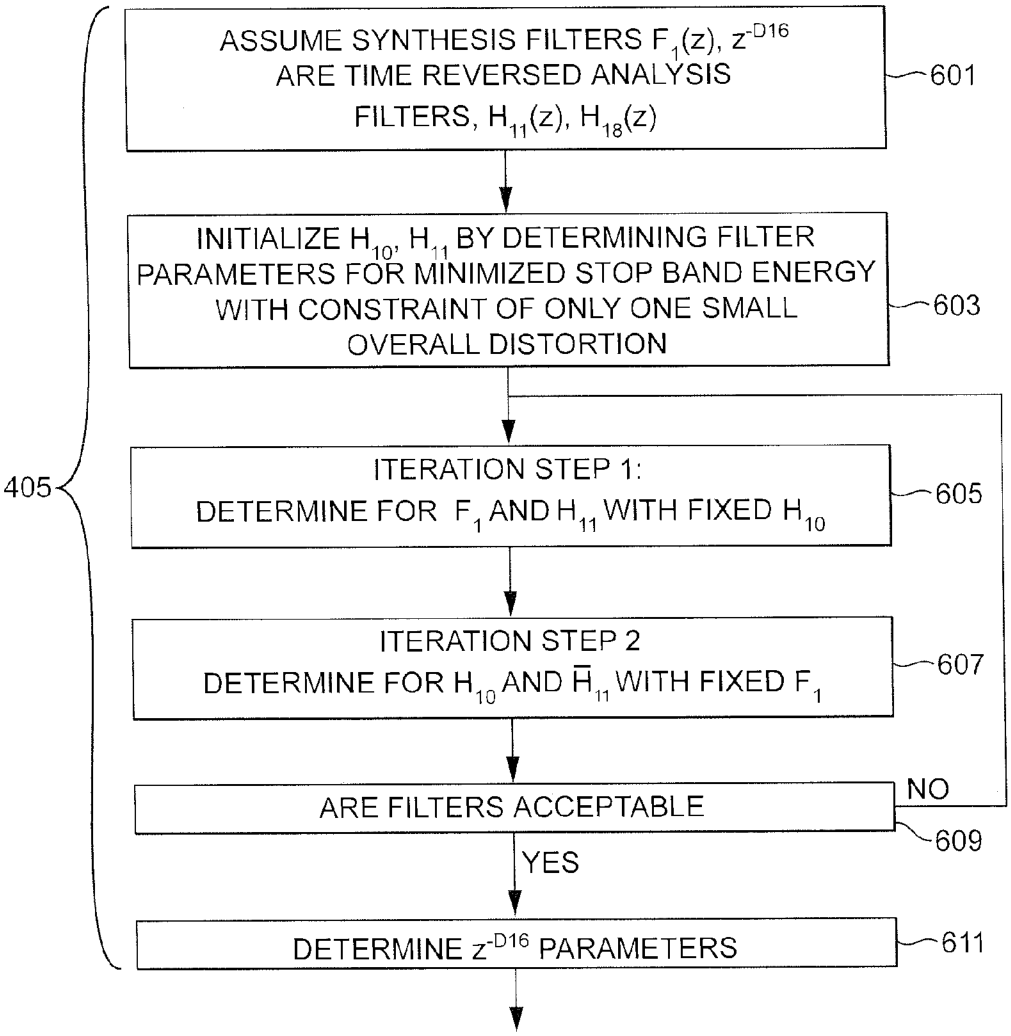
FIG. 7 shows a flow diagram illustrating the operation of the inner filter bank optimization according to embodiments of the invention.

The operation of initializing filter parameters for $H_{10}$, and $H_{11}$ is shown in step 603 of FIG. 7.

The controller 105 may now remove the assumption that the synthesis inner part filters $F_{11}(z^{-D16})$ 243 and $F_{10}$ 248 are time reversed versions of the analysis inner part filters $H_{11}$ 207 and $H_{10}$ 208 respectively. The controller 105 may in some embodiments initialize an iterative step process to produce more acceptable filter parameters.

The controller 105 may determine parameters for the second synthesis filter bank inner part filter $F_1$ 248 and the first analysis filter bank inner part filter $H_{11}$ 207 with a fixed second analysis filter bank inner part filter $H_{10}$ 208, in other words attempting to select $F_1$ and $H_{11}$ filters to solve the following expression:

$$\min_{F_1,H_{11}} \lambda_{12}\int_{\omega_{10}}^{\pi}|F_1(\omega)|^2+\lambda_{11}\int_0^{\omega_{11}}|H_{11}(\omega)|^2$$

$$\text{s.t.}\left|\frac{1}{2}H_{10}(\omega)F_1(\omega)+H_{11}(\omega)e^{-j\omega D_{16}}-e^{-j\omega L_1}\right|\le\delta_1(\omega),$$

$$\omega\in\Omega,$$

with fixed $H_{10}(\omega)$ and where Ω refers to a grid of frequencies, $\delta_1(\omega)$ defines the distortion allowed for each of these frequencies, $\omega_{10}$ and $\omega_{11}$ refer to the stop band of the low and mid frequency bands and $\lambda_{10}$ and $\lambda_{11}$ represents weighting functions.

The performance of iteration step 1 of determining filters $F_1$ and $H_{11}$ with a fixed $H_{10}$ is shown in FIG. 7 by step 605.

The controller 105 in the second part of the iteration then attempts to determine parameters for the first analysis filter bank inner part filter $H_{11}$ 207 and the second analysis filter bank inner part filter $H_{10}$ 208 with respect to the following equation:

$$\min_{H_{10},H_{11}} \lambda_{10}\int_{\omega_{10}}^{\pi}|H_{10}(\omega)|^2+\lambda_{11}\int_0^{\omega_{11}}|H_{11}(\omega)|^2$$

$$\text{s.t.}\left|\frac{1}{2}H_{10}(\omega)F_1(\omega)+H_{11}(\omega)e^{-j\omega D_{16}}-e^{-j\omega L_1}\right|\le\delta_1(\omega),$$

-continued $$\omega \in \Omega,$$

where there is a fixed $F_1(\omega)$. As before $\Omega$ refers to a grid of frequencies, $\delta_1(\omega)$ defines the distortion allowed for each of these frequencies, $\omega_{10}$ and $\omega_{11}$ refer to the stop band of the low and mid frequency bands and $\lambda_{10}$ and $\lambda_{11}$ represents weighting functions. Both of the iteration processes problems may be expressed as a second order cone problem and solved iteratively by the controller 105. —The second order cone problem is a special case of the semidefinate problem, In some embodiments therefore solutions similar to those applied above with respect to the semidefinate solution may be applied. In some other embodiments the a second order cone solution may be applied such as those given by F. Alizadeh and D. Goldfarb, "Second-order cone programming", Mathematical Programming, Volume 95, Number 1, pp 3-51, 2003, which may be referenced from the internet on http://www.springerlink.com/index/J5G1JR7C4BR8Y656.pdf).

The controller 105 may select the parameters to minimise the stop band energy with the constraint is to have only one small overall distortion which also forces the pass band close to one.

The operation determining parameters for the first and second analysis filter bankfilters $H_{11}$ 207 and $H_{10}$ 208 with a fixed second synthesis filter bank inner part filter $F_1$ 248 is shown in FIG. 7 by step 607.

The controller 105 may then perform a check step to determine whether or not the filters generated by the current parameters are acceptable with respect to predefined criteria. The check step is shown in FIG. 7 by step 609.

Where the check step determines that the filters are acceptable, the operation then passes to step 611. Where the check step determines that further iteration is required, the controller 105 passes back to the first part of the iteration determining the parameters for the synthesis filter $F_1$ and analysis filter $H_{11}$ with respect to a fixed $H_{10}$.

The controller 105 iterations will depend upon the initialization and weighting values. Shorter determined initial filters $H_{10}$ and $H_{11}$ have been shown in experiments by the inventors to provide better filter solutions. Furthermore the controller may use a time reversed $H_{10}$ (in other words a maximum phase filter) as an initial estimate for the $F_1$ filter where time synchronisation between the sub-bands is important.

The overall delay for the inner filterbank $L_1$ may be set according to any suitable value. The controller 105 may select the value for the pure delay filter $F_{11}$ ($z^{-D16}$) dependent on the length of the determined filter $H_{11}$. Specifically in some embodiments the controller may determine the value for the filter $F_{11}$ so that the group delay for the filter $H_{11}$ and the filter $F_{11}$ adds up to approximately the total delay $L_1$. The determination of the $F_{11}$ parameters is shown in FIG. 7 by step 611

The controller 105 may in some embodiments determine the parameters for the first analysis filter bank inner part filter $H_{11}$ 207 to have approximately linear phase, in other words having a constant delay. The controller 105 may in some embodiments determine filter parameters so that the filters $H_{10}$ 208 and $F_1$ 248 delay may differ between frequencies but have a convolved filter characteristic $H_{10}(z)F_1(z)$ having an approximately constant delay $L_1$ on all frequencies.

Figure 9:
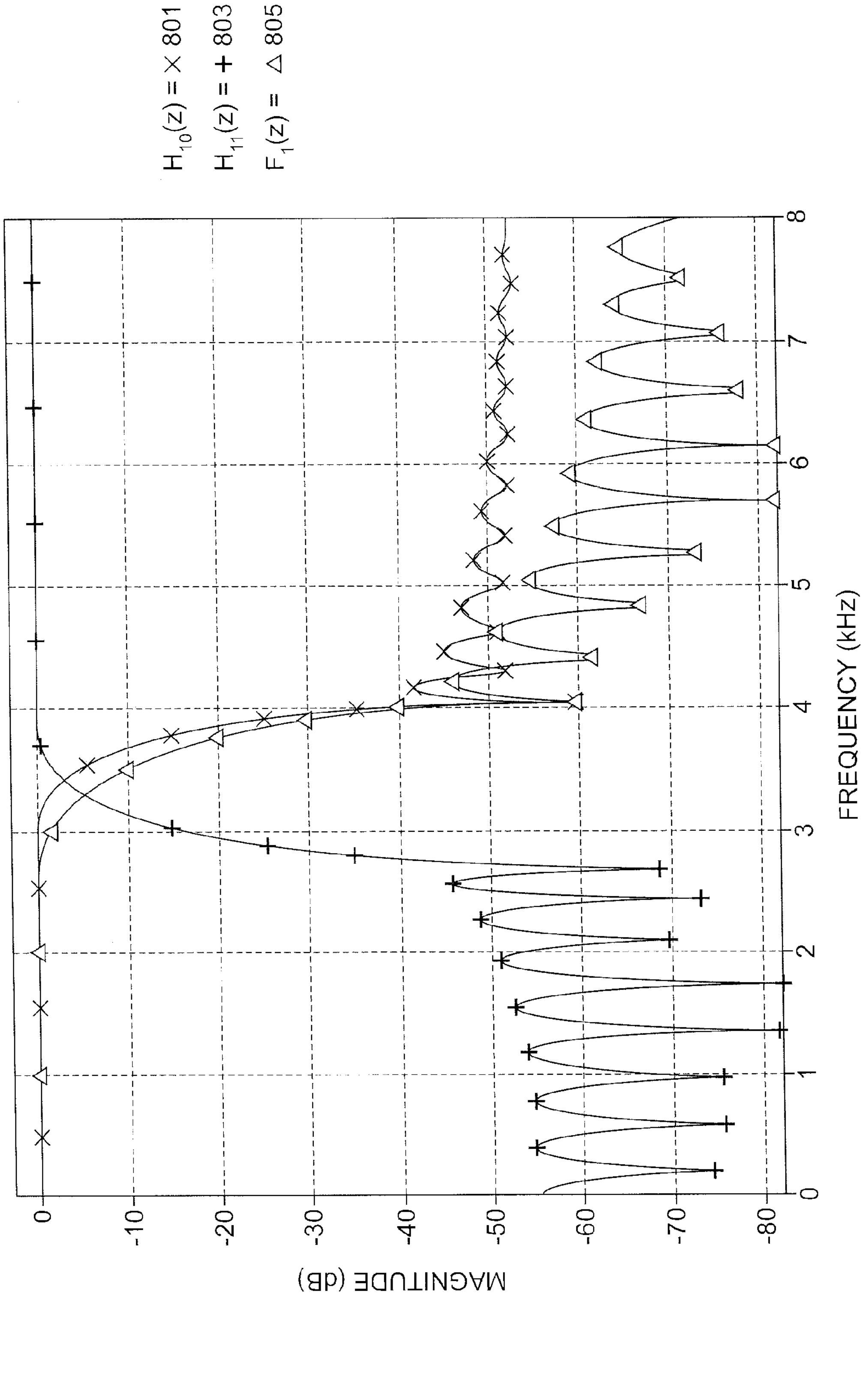
FIG. 9 shows schematically spectrograms depicting the inner filter bank responses according to embodiments of the invention.

With respect to FIG. 9, suitable example frequency responses for the second synthesis filter bank inner part filter $F_1$ 248, the first analysis filter bank inner part filter $H_{11}$ 207 and second analysis filter bank inner part filter $H_{10}$ 208 are shown. In these examples the mid frequency band analysis filter, the first analysis filter bank inner part filter $H_{11}$ 207, frequency response is marked by crosses '+' 803 and has a near linear response in the pass band from 4 kHz upwards. The low band analysis filter, the second analysis filter bank inner part filter $H_{10}$ 208, frequency response is shown by the trace marked by crosses 'x' 801 and is shown with a stop band from 4 kHz (attenuation greater than 40 db). The low synthesis filter, the second synthesis filter bank inner part filter $F_1$ 248, frequency response is defined by the trace marked by triangles 'Δ' 805 is shown with shown with a stop band from 4 kHz.

The controller 105 makes a particular care with the design characteristics for the interpolator filter $F_1$. The controller may do this because the low frequencies may be particularly strong and the filter is configured to attenuate the mirror image. The decimator may not produce significant attenuation as the frequencies that alias after attenuation are relatively low compared to the frequencies on the low band. The design processed by the controller may not provide strict means to control the attenuations separately, however the controller may increase $\square_{12}$ in the first iteration operation to increase the stop band attenuation of $F_1$ filter.

Although the above has been described with regards to mono signals, stereo signals and polyphonic signals may also be applied to various embodiments. In these embodiments the background noise estimate is computed first for all of the channels or pairs of channels and for each band, then for each band the smaller value is stored as the background noise estimate. In these embodiments there is the aim of these embodiments to attenuate the distant noise sources. The operation of the process as described above in these embodiments does not suppress the audio information where the record source or signal origin is so close to the recording device that its level is significantly different at different microphones or recording points.

Although the above describes the apparatus and the digital audio processor 103 with a specific structure it would be understood that there may be many alternative implementations possible according to the embodiment.

For example in some embodiments of the application, the digital audio processor 103 may have a different ordering for the outer and inner filter banks. In these embodiments the analysis inner filter bank operation may occur before the outer filter bank operation and similarly the synthesis outer filter bank may occur before the inner bank operation.

In some embodiments the sampling rate for any of the high, mid, or low frequency bands may differ from the values described above. For example in some embodiments the mid frequency band may have a sampling frequency of 24 kHz Furthermore in some embodiments, rather than using a 48 kHz sampled frequency input signal the input signal may be a 44.1 kHz sampled signal, in other words a compact disc (CD) formatted digital signal. In these embodiments, the mid and low bands using the structured described in the embodiments above may be considered to have a 14.7 kHz (mid frequency band) and 7.35 kHz (low frequency band) sampling rates respectively.

In some embodiments of the invention the input may be a signal with a 32 kHz sampling frequency because typically signals above 14 kHz may not be considered to be important and have little information at those frequencies. In such embodiments both outer and inner filterbanks may be configured to upsample and downsample by a factor of two.

In other embodiments of the invention, the controller 105 may configure the outer interpolator filter $F_0$ 246 with more than one 'zero' and may configure these 'zero's'at suitable frequencies depending on the signals to be processed besides.

Furthermore as the number and size of the sub-bands on the main band is dictated by the requirements of the noise suppression, other applications such as dynamic range control (DRC) may use different numbers of side bands and side bands with different sub-band widths.

In some embodiments of the invention, fewer or more bands than the three bands shown in the embodiments described above may be used. For example in some embodiments in order to obtain sufficient frequency resolution for suppressing stronger noise for lower frequency components the low frequency band may be further divided. For example in these embodiments the low band 0 to 4 kHz may be divided into a high-low band 2 kHz to 4 kHz and a low-low band up to 2 kHz.

In some embodiments the cosine based modulated filter banks described for operation in the sub-band filters may use a higher or lower values of M for the prototype filter and combine suitable filter coefficients to produce the sub-band distribution required.

In order to produce better frequency resolution, in some embodiments of the invention, Fast Fourier Transforms may be used on the lowest band.

Furthermore the digital audio processor 103 may be configured to be used for audio rendering, in other words for music dynamic range control DRC. In such embodiments 16 bit and higher processing may be used in order to provide sufficient quality.

Such embodiments of the invention may produce audio quality sufficient for audio recording, with a filter which requires relatively low memory requirements (both for in terms of buffer size and filter coefficient storage). Furthermore in the above described embodiments the filters may have tolerable computational complexity and a relatively short delay as decimators and interpolators are only used when they are required.

Thus in some embodiments of the application there may be a method comprising the operations of filtering an audio signal into at least three frequency band signals, generating for each frequency band signal a plurality of sub-band signals, processing at least one sub-band signal from at least one frequency band, and combining the processed sub-band signals to form a combined processed audio signal.

In some other embodiments there may be apparatus comprising at least one processor and at least one memory including computer program code the at least one memory and the computer program code configured to, with the at least one processor, cause the apparatus at least to perform the operations described above.

Furthermore in some embodiments apparatus may comprise at least one filter configured to filter an audio signal into at least three frequency band signals, at least one filterbank configured to generate for each frequency band signal a plurality of sub-band signals, a signal processor configured to process at least one sub-band signal from at least one frequency band, and a signal combiner configured to combine the processed sub-band signals to form a combined processed audio signal.

Although the above examples describe embodiments of the invention operating an within an electronic device 10 or apparatus, it would be appreciated that the invention as described below may be implemented as part of any audio processing stage within a chain of audio processing stages.

Furthermore user equipment, universal serial bus (USB) sticks, and modern data cards may comprise audio capture apparatus such as the apparatus described in embodiments above.

It shall be appreciated that the term user equipment is intended to cover any suitable type of wireless user equipment, such as mobile telephones, portable data processing devices or portable web browsers.

Furthermore elements of a public land mobile network (PLMN) may also comprise audio capture and processing apparatus as described above.

In general, the various embodiments described above may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of the application may be implemented by computer software executable by a data processor, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example digital versatile disc (DVD), compact discs (CD) and the data variants thereof both.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

As used in this application, the term circuitry may refer to all of the following: (a) hardware-only circuit implementations (such as implementations in only analogue and/or digital circuitry) and (b) to combinations of circuits and software (and/or firmware), such as and where applicable: (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of circuitry applies to all uses of this term in this application, including in any claims. As a further example, as used in this application, the term circuitry would also cover an implementation of merely a processor (or multiple processors) or portion of a processor and its (or their) accompanying software and/or firmware. The term circuitry would also cover, for example and if applicable to the particular claim element, a baseband integrated circuit or applications processor integrated circuit for a mobile phone or a similar integrated circuit in server, a cellular network device, or other network device.

The term processor and memory may comprise but are not limited to in this application: (1) one or more microprocessors, (2) one or more processor(s) with accompanying digital signal processor(s), (3) one or more processor(s) without accompanying digital signal processor(s), (3) one or more special-purpose computer chips, (4) one or more field-programmable gate arrays (FPGAS), (5) one or more controllers, (6) one or more application-specific integrated circuits (ASICS), or detector(s), processor(s) (including dual-core and multiple-core processors), digital signal processor(s), controller(s), receiver, transmitter, encoder, decoder, memory (and memories), software, firmware, RAM, ROM, display, user interface, display circuitry, user interface circuitry, user interface software, display software, circuit(s), antenna, antenna circuitry, and circuitry.

The invention claimed is:

1. A method comprising:

filtering an audio signal into at least three frequency band signals;

for each frequency band signal, filtering the frequency band signal into a plurality of sub-band signals by:

generating an M-band bandfilter;

selecting at least two bands from the M-band bandfilter and combining outputs for the at least two bands to create a modified M-band bandfilter; and applying the modified M-band bandfilter to the frequency band signal to generate the sub-band signals for the frequency band signal;

processing at least one sub-band signal from at least one frequency band signal; and combining the processed sub-band signals to form a combined processed audio signal.

2. The method as claimed in claim 1, wherein filtering an audio signal into at least three frequency band signals comprises:

high-pass filtering the audio signal into a first of at least three frequency band signals;

low-pass filtering the audio signal into a low-pass filtered signal; and downsampling the low-pass filtered audio signal to generate a combined second and third of the at least three frequency band signals.

3. The method as claimed in claim 1, wherein processing at least one sub-band signal from at least one frequency band comprises:

applying noise suppression to the at least one sub-band signal from the at least one frequency band signal.

4. The method as claimed in claim 1, wherein combining the processed sub-band signals to form a combined processed audio signal comprises:

combining the processed sub-band signals to form at least three processed frequency band signals.

5. The method as claimed in claim 4, wherein combining the processed sub-band signals to form a combined processed audio signal further comprises:

upsampling a first of the at least three processed frequency band signals;

low pass filtering the upsampled first of the at least three processed frequency band signals; and combining the low pass filtered, upsampled, first of the at least three processed frequency band signals with a second of the at least three processed frequency band signals to generate a combined first and second of the at least three processed frequency band signals.

6. An apparatus comprising at least one processor and at least one memory including computer program code, the at least one memory and the computer program code configured to, with the at least one processor, cause the apparatus at least to perform:

filtering an audio signal into at least three frequency band signals;

for each frequency band signal, filtering the frequency band signal into a plurality of sub-band signals by:

generating an M-band bandfilter;

selecting at least two bands from the M-band bandfilter and combining the outputs for the at least two bands to create a modified M-band bandfilter; and applying the modified M-band bandfilter to the frequency band to generate the sub-band signals for the frequency band signal;

processing at least one sub-band signal from at least one frequency band signal; and combining the processed sub-band signals to form a combined processed audio signal.

7. The apparatus as claimed in claim 6, wherein the filtering an audio signal into at least three frequency band signals cause the apparatus at least to further perform:

high-pass filtering the audio signal into a first of at least three frequency band signals;

low-pass filtering the audio signal into a low-pass filtered signal; and downsampling the low-pass filtered audio signal to generate a combined second and third of the at least three frequency band signals.

8. The apparatus as claimed in claim 7, wherein filtering an audio signal into at least three frequency band signals cause the apparatus at least to further perform:

high-pass filtering the combined second and third of the at least three frequency band signals to form the second of the at least three frequency band signals;

low-pass filtering the combined second and third of the at least three frequency band signals; and downsampling the low-pass filtered combined second and third of the at least three frequency band signals to generate the third of the at least three frequency band signals.

9. The apparatus as claimed in claim 6, wherein processing at least one sub-band signal from at least one frequency band cause the apparatus at least to further perform applying noise suppression to the at least one sub-band signal from the at least one frequency band.

10. The apparatus as claimed in claim 6, wherein combining the processed sub-band signals to form a combined processed audio signal cause the apparatus at least to further perform combining the processed sub-band signals to form at least three processed frequency band signals.

11. The apparatus as claimed in claim 10, wherein combining the processed sub-band signals to form a combined processed audio signal further cause the apparatus at least to further perform:

upsampling a first of the at least three processed frequency band signals;

low pass filtering the upsampled first of the at least three processed frequency band signals; and combining the low pass filtered, upsampled, first of the at least three processed frequency band signals with a second of the at least three processed frequency band signals to generate a combined first and second of the at least three processed frequency band signals.

12. The apparatus as claimed in claim 11, wherein combining the processed sub-band signals to form a combined processed audio signal cause the apparatus at least to further perform delaying the second of the at least three processed frequency band signals so to synchronize the low pass filtered, upsampled, first of the at least three processed frequency band signals with the second of the at least three processed frequency band signals.

13. The apparatus as claimed in claim 11, wherein combining the processed sub-band signals cause the apparatus at least to further perform:

upsampling the combined first and second of the at least three processed frequency band signals;

low pass filtering the upsampled combined first and second of the at least three processed frequency band signals; and combining the low pass filtering the upsampled combined first and second of the at least three processed frequency band signals with a third of the at least three processed frequency band signals to generate the combined processed audio signal.

14. The apparatus as claimed in claim 7, wherein the at least one processor and at least one memory is further configured to perform configuring a first set of filters comprising: a first filter for the high-pass filtering of the audio signal into a first of at least three frequency band signals; a second filter for the low-pass filtering of the audio signal into a low-pass filtered signal; and a third filter for the low pass filtering of the upsampled combined first and second of the at least three processed frequency band signals.

15. The apparatus as claimed in claim 8, wherein the at least one processor and at least one memory is further configured to perform configuring a second set of filters comprising:

a first filter for the high-pass filtering of the combined second and third of the at least three frequency band signals to form the second of the at least three frequency band signals; a second filter for the low-pass filtering of the combined second and third of the at least three frequency band signals; and a third filter for low pass filtering of the upsampled first of the at least three processed frequency band signals.

16. A non-transitory computer-readable medium encoded with instructions that, when executed by a computer, perform:

filtering an audio signal into at least three frequency band signals;

for each frequency band signal, filtering the frequency band signal into a plurality of sub-band signals by:

generating an M-band bandfilter;

selecting at least two bands from the M-band bandfilter and combining the outputs for the at least two bands to create a modified M-band bandfilter; and applying the modified M-band bandfilter to the frequency band to generate the sub-band signals for the frequency band signal;

processing at least one sub-band signal from at least one frequency band signal; and combining the processed sub-band signals to form a combined processed audio signal.

17. The method as claimed in claim 1,wherein the same M-band filter is used for each frequency band signal and wherein combining of the outputs for the at least two bands of the M-band bandfilter is performed differently for at least some of the frequency band signals.

18. The method as claimed in claim 1, wherein the combining of the outputs for the at least two bands of the M-band bandfilter is accomplished by adding up the corresponding filter coefficients for the at least two frequency bands.

19. The apparatus as claimed in claim 6, wherein the at least one processor and at least one memory is configured to use the same M-band filter for each frequency band signal and is configured to combine the outputs for the at least two bands of the M-band bandfilter differently for at least some of the frequency band signals.

20. The apparatus as claimed in claim 6, wherein the at least one processor and at least one memory is configured to combine the outputs for the at least two bands of the M-band bandfilter by adding up the corresponding filter coefficients for the at least two frequency bands.

* * * * *